United States Patent
Yang et al.

(10) Patent No.: US 12,255,666 B2
(45) Date of Patent: Mar. 18, 2025

(54) GENERALIZED LDPC ENCODER, GENERALIZED LDPC ENCODING METHOD AND STORAGE DEVICE

(71) Applicant: SAMSUNG ELECTRONICS CO., LTD., Suwon-si (KR)

(72) Inventors: Daeyeol Yang, Suwon-si (KR); Bohwan Jun, Suwon-si (KR); Hongrak Son, Suwon-si (KR); Geunyeong Yu, Suwon-si (KR); Youngjun Hwang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 51 days.

(21) Appl. No.: 18/225,313

(22) Filed: Jul. 24, 2023

(65) Prior Publication Data

US 2024/0120945 A1  Apr. 11, 2024

(30) Foreign Application Priority Data

Oct. 6, 2022 (KR) .................. 10-2022-0127935

(51) Int. Cl.
*H03M 13/11* (2006.01)
*H03M 13/00* (2006.01)
(Continued)

(52) U.S. Cl.
CPC ...... *H03M 13/116* (2013.01); *H03M 13/1102* (2013.01); *H03M 13/1108* (2013.01);
(Continued)

(58) Field of Classification Search
CPC .......... H03M 13/116; H03M 13/1102; H03M 13/1108; H03M 13/1111; H03M 13/1137;
(Continued)

(56) References Cited

U.S. PATENT DOCUMENTS 6,661,355 B2 *  12/2003  Cornelius ............. H03M 13/41
                                                         341/95
7,679,133 B2     3/2010   Son et al.
(Continued)

FOREIGN PATENT DOCUMENTS

WO     2019/013662 A1     1/2019

OTHER PUBLICATIONS

Liu et al., On the Design of Generalized LDPC Codes with Component BCJR Decoding, 2020, IEEE, pp. 1-6. (Year: 2020).*
(Continued)

*Primary Examiner* — John J Tabone, Jr.
(74) *Attorney, Agent, or Firm* — Sughrue Mion, PLLC

(57) ABSTRACT

A generalized low-density parity-check (G-LDPC) encoder, including a plurality of generalized constraint (GC) encoders configured to perform a plurality of GC encoding operations in parallel based on a GC code having a quasi-cyclic (QC) structure including information variable nodes, inner parity variable nodes, and super check nodes configured to perform multiple condition checks, wherein each GC encoder of the plurality of GC encoders includes a plurality of first logic circuits configured to perform a GC encoding operation of the plurality of GC encoding operations; and an LDPC encoder configured to perform an LDPC encoding operation based on an LDPC code having the QC structure, wherein the LDPC encoder includes a plurality of single check nodes configured to perform a single parity check, wherein the each GC encoder is configured to receive information bits, and to determine parity bits of a portion of inner parity bits corresponding to the information bits by enabling only a portion of the plurality of first logic circuits to perform the GC encoding operation, and wherein the LDPC encoder is configured to: obtain the inner parity bits by combining the parity bits obtained from the plurality of GC encoders,
(Continued)

determine outer parity bits corresponding to the information bits and the inner parity bits by performing the LDPC encoding operation, and output the information bits, the inner parity bits, and the outer parity bits as a codeword.

20 Claims, 18 Drawing Sheets

(51) Int. Cl.
    *H03M 13/13*     (2006.01)
    *H03M 13/15*     (2006.01)
    *H03M 13/19*     (2006.01)

(52) U.S. Cl.
    CPC .... *H03M 13/1111* (2013.01); *H03M 13/1137* (2013.01); *H03M 13/1174* (2013.01); *H03M 13/1177* (2013.01); *H03M 13/611* (2013.01); *H03M 13/616* (2013.01); *H03M 13/6561* (2013.01); *H03M 13/6563* (2013.01); *H03M 13/13* (2013.01); *H03M 13/152* (2013.01); *H03M 13/19* (2013.01)

(58) Field of Classification Search
    CPC ......... H03M 13/1174; H03M 13/1177; H03M 13/611; H03M 13/616; H03M 13/6561; H03M 13/6563; H03M 13/13; H03M 13/152; H03M 13/19
    USPC ........ 714/752, 777, 782, 784, 785, 799, 800
    See application file for complete search history.

(56) References Cited

U.S. PATENT DOCUMENTS

| | | |
|---|---|---|
| 8,553,466 B2 | 10/2013 | Han et al. |
| 8,559,235 B2 | 10/2013 | Yoon et al. |
| 8,654,587 B2 | 2/2014 | Yoon et al. |
| 10,193,574 B1 | 1/2019 | Teitel et al. |
| 11,057,049 B2 * | 7/2021 | Usatyuk ............. H03M 13/1174 |
| 11,075,651 B2 * | 7/2021 | Usatyuk ............. H03M 13/036 |
| 2002/0118126 A1 * | 8/2002 | Cornelius ............. H03M 13/41 341/96 |
| 2006/0294445 A1 | 12/2006 | Divsalar et al. |
| 2009/0199065 A1 | 8/2009 | Djordjevic et al. |
| 2010/0153812 A1 | 6/2010 | Jin et al. |
| 2011/0233648 A1 | 9/2011 | Seol et al. |
| 2015/0106680 A1 * | 4/2015 | Djordjevic ................ H04L 1/00 714/776 |
| 2016/0094246 A1 | 3/2016 | Vasista Srinivasan Ranganathan et al. |
| 2017/0331498 A1 * | 11/2017 | Freudenberger .. H03M 13/1505 |
| 2018/0343020 A1 * | 11/2018 | Kumar ............. H03M 13/2906 |
| 2018/0358984 A1 | 12/2018 | Richardson et al. |
| 2019/0097657 A1 | 3/2019 | Chiu et al. |
| 2020/0099395 A1 * | 3/2020 | Sharon ............... H03M 13/1105 |
| 2020/0387427 A1 * | 12/2020 | Mekhanik ............... G06F 3/064 |
| 2024/0106462 A1 * | 3/2024 | Yang ...................... G11C 29/42 |
| 2024/0120945 A1 * | 4/2024 | Yang .................. H03M 13/1174 |

OTHER PUBLICATIONS

Tee et al., Generalized Low-Density Parity-Check Coding Aided Multilevel Codes, 2006, IEEE, pp. 2398-2402. (Year: 2006).*
Zhilin et al., Generalized Concatenated Codes with Soft Decoding of Inner and Outer Codes, 2016, IEEE, pp. 290-294. (Year: 2016).*
Vo Tam Van et al., "A Class of Generalized Quasi-Cyclic LDPC Codes: High-Rate and Low-Complexity Encoder for Data Storage Devices", IEEE Global Telecommunications Conference, GLOBECOM 2010, Dec. 6, 2010, pp. 1-6.
Liva G et al., "Quasi-Cyclic Generalized LDPC Codes with Low Error Floors", IEEE Transactions on Communications, vol. 56, No. 1, Jan. 1, 2008, pp. 49-57.
Tong Zhang et al., "A class of efficient-encoding generalized low-density parity-check codes" Proc., IEEE International Conference on Acoustics, Speech, and Signal Processing, May 7-11, 2001, pp. 2477-2480.
European Extended Search Report issued Jan. 4, 2024 by the European Patent Office for EP Patent Application No. 23201311.0.

* cited by examiner $$\begin{array}{c} \phantom{CN1}\ \ \text{VN1 VN2 VN3 VN4 VN5 VN6} \\ \begin{array}{c} \text{CN1} \\ \text{CN2} \\ \text{CN3} \end{array} \left[ \begin{array}{cccccc} 1 & 1 & 1 & 1 & 0 & 0 \\ 0 & 1 & 1 & 0 & 1 & 0 \\ 1 & 1 & 0 & 0 & 0 & 1 \end{array} \right] \end{array}$$

Information column matrix · Parity column matrix

FIG. 2C

GENERALIZED LDPC ENCODER, GENERALIZED LDPC ENCODING METHOD AND STORAGE DEVICE

CROSS-REFERENCE TO RELATED APPLICATION(S)

This application is based on and claims the priority under 35 USC § 119 to Korean Patent Application No. 10-2022-0127935, filed on Oct. 6, 2022, in the Korean Intellectual Property Office, the disclosure of which is incorporated by reference herein in its entirety.

BACKGROUND

1. Field

The disclosure relates to a generalized low density parity check (G-LDPC) encoder, a G-LDPC encoding method, and a storage device.

2. Description of Related Art

Non-volatile memory devices are widely used as audio and video data storage media for information devices such as computers, smartphones, personal digital assistants (PDAs), digital cameras, camcorders, voice recorders, portable music players, and handheld computers. An example of a non-volatile memory-based mass storage device is a solid state drive (SSD).

When data is programmed into memory cells of the non-volatile memory, threshold voltages of the memory cells form a threshold voltage distribution within a certain range. The threshold voltage distribution may deteriorate as the operation of the non-volatile memory continues. When the threshold voltage distribution is degraded, data read by performing a read operation at a previously defined read level may include many error bits.

To detect and correct errors in the read data, an error correction technique such as Low Density Parity Check (LDPC) or the like may be used. LDPC is a technique for detecting and correcting data errors by repeatedly updating variable nodes and check nodes which are connected to each other. Connections between variable nodes and check nodes may be defined by a parity check matrix.

In addition, research is being conducted to expand the concept of LDPC. For example, Generalized LDPC (G-LDPC) is being studied, in which the concept of detecting data errors is expanded by performing a single parity check operation on variable nodes connected to a check node, and data errors are detected by checking multiple conditions on variable nodes connected to a super check node.

SUMMARY

Provided is a G-LDPC encoder in which parallel processing performance may be improved as multiple condition check operations included in a G-LDPC encoding operation are performed in parallel by a plurality of logic circuits.

Also provided is a storage device in which reliability of stored data may be ensured by quickly performing G-LDPC encoding to generate a codeword in which parity bits are added to data and storing the codeword.

Additional aspects will be set forth in part in the description which follows and, in part, will be apparent from the description, or may be learned by practice of the presented embodiments.

In accordance with an aspect of the disclosure, a generalized low-density parity-check (G-LDPC) encoder includes a plurality of generalized constraint (GC) encoders configured to perform a plurality of GC encoding operations in parallel based on a GC code having a quasi-cyclic (QC) structure including information variable nodes, inner parity variable nodes, and super check nodes configured to perform multiple condition checks, wherein each GC encoder of the plurality of GC encoders includes a plurality of first logic circuits configured to perform a GC encoding operation of the plurality of GC encoding operations; and an LDPC encoder configured to perform an LDPC encoding operation based on an LDPC code having the QC structure, wherein the LDPC encoder includes a plurality of single check nodes configured to perform a single parity check, wherein the each GC encoder is configured to receive information bits, and to determine parity bits of a portion of inner parity bits corresponding to the information bits by enabling only a portion of the plurality of first logic circuits to perform the GC encoding operation, and wherein the LDPC encoder is configured to: obtain the inner parity bits by combining the parity bits obtained from the plurality of GC encoders, determine outer parity bits corresponding to the information bits and the inner parity bits by performing the LDPC encoding operation, and output the information bits, the inner parity bits, and the outer parity bits as a codeword.

In accordance with an aspect of the disclosure, a generalized low-density parity-check (G-LDPC) encoding method includes generating a basic generalized constraint (GC) code parity check matrix (PCM) comprising information variable nodes, inner parity variable nodes, and a plurality of super check nodes configured to perform multiple condition checks; generating a basic LDPC code PCM including the information variable nodes, the inner parity variable nodes, outer parity variable nodes, and a plurality of single check nodes configured to perform a single parity check; concatenating the basic GC code PCM and the basic LDPC code PCM to generate a concatenated PCM; generating a G-LDPC code PCM having a quasi-cyclic (QC) structure by lifting the concatenated PCM; activating a portion of the super check nodes such that a number of super check nodes connected to each inner parity variable node is one (1) in the G-LDPC code PCM having the QC structure; receiving information bits and generating inner parity bits corresponding to the information bits by performing a GC encoding operation based on the activated portion of the super check nodes; generating outer parity bits corresponding to the information bits and the inner parity bits by performing an LDPC encoding operation based on the plurality of single check nodes; and outputting the information bits, the inner parity bits and the outer parity bits as codewords.

In accordance with an aspect of the disclosure, a storage device includes a storage controller configured to: receive information bits, generate parity bits for the information bits by performing a generalized low density parity check (G-LDPC) encoding operation based on a G-LDPC code having a quasi-cyclic (QC) structure, and output the information bits and the parity bits as a codeword; and a non-volatile memory device configured to store the codeword output from the storage controller, wherein the storage controller is further configured to: adjust a generalized constraint (GC) code comprising information variable nodes, inner parity variable nodes having a degree of two or more, and a plurality of super check nodes configured to perform multiple condition checks, by deactivating a portion of the super check nodes such that the inner parity variable nodes have a degree of one, and perform the G-LDPC encoding operation based on the G-LDPC code in which the adjusted GC code is concatenated with an LDPC code including the information variable nodes, the inner parity variable nodes, outer parity variable nodes, and a plurality of single check nodes configured to perform a single parity check.

BRIEF DESCRIPTION OF DRAWINGS

The above and other aspects, features, and advantages of certain embodiments of the present disclosure will be more apparent from the following description taken in conjunction with the accompanying drawings, in which:

FIGS. 2A to 2C are diagrams illustrating LDPC codes and LDPC decoding, according to an embodiment;

DETAILED DESCRIPTION

Hereinafter, example embodiments are described with reference to the accompanying drawings.

As is traditional in the field, embodiments may be described and illustrated in terms of blocks which carry out a described function or functions. These blocks, which may be referred to herein as units or modules or the like, or by names such as controller, accelerator, interface, encoder, decoder, manager, circuit, sensor, or the like, may be physically implemented by analog or digital circuits such as logic gates, integrated circuits, microprocessors, microcontrollers, memory circuits, passive electronic components, active electronic components, optical components, hardwired circuits, or the like, and may be driven by firmware and software. The circuits may, for example, be embodied in one or more semiconductor chips, or on substrate supports such as printed circuit boards and the like. Circuits included in a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks. Likewise, the blocks of the embodiments may be physically combined into more complex blocks.

Figure 1:
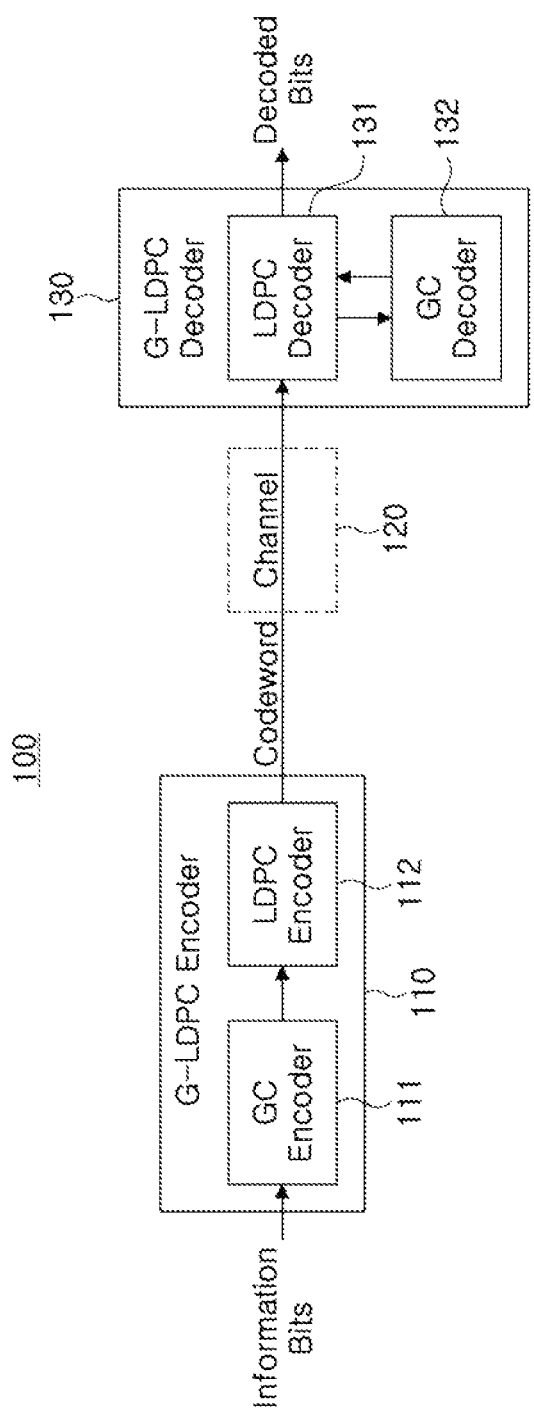
FIG. 1 is a block diagram illustrating a signal transmission system according to an embodiment.

FIG. 1 is a block diagram illustrating a signal transmission system according to an example embodiment.

Referring to FIG. 1, a signal transmission system 100 may include a Generalized Low Density Parity Check (G-LDPC) encoder 110, a channel 120 and a G-LDPC decoder 130.

The signal transmission system 100 may be a communication system or a storage device. For example, when the signal transmission system 100 is a communication system including a transmitter and a receiver, the G-LDPC encoder 110 may be included in the transmitter and the G-LDPC decoder 130 may be included in the receiver. As another example, when the signal transmission system 100 is a storage device including a storage controller and a non-volatile memory device, the G-LDPC encoder 110 and the G-LDPC decoder 130 may be included in the storage controller.

The G-LDPC encoder 110 may perform G-LDPC encoding operation on the received information bits to generate a G-LDPC codeword including information bits and parity bits.

For example, the G-LDPC encoder 110 may include a generalized constraint (GC) encoder 111 and an LDPC encoder 112 (illustrated as "LDPC_ENC"). The LDPC encoder 112 may generate a codeword by performing LDPC encoding operation using a parity check matrix (PCM). The LDPC encoder 112 may determine a parity bit value based on a connection between variable nodes defined by PCM and check nodes.

The value of the parity bit in the LDPC encoder 112 may be determined by a single parity operation of variable nodes connected to the check node. The GC encoder 111 may further generalize the concept of single parity operation at the check node and determine the value of the parity bit based on multiple conditions at the check node. For example, the GC encoder 111 may determine a parity bit value by performing an operation such as a Bose-Chaudhuri-Hocquenghem (BCH) code or a Hamming code on variable nodes connected to the check node. Hereinafter, a check node for single parity operation may be referred to as a single check node, and a check node for multi-condition operation may be referred to as a super check node. Also, an encoding technique based on the super check node may be referred to as GC encoding.

When information bits are received by the G-LDPC encoder 110, inner parity bits may be generated by performing a GC encoding operation on the information bits by the GC encoder 111. In addition, outer parity bits may be generated by performing an LDPC encoding operation on the information bits and inner parity bits by the LDPC encoder 112. The information bits, inner parity bits and outer parity bits may be output from the G-LDPC encoder 110 as codewords.

The codeword output from the G-LDPC encoder 110 may be delivered to the G-LDPC decoder 130 through the channel 120. As the codeword passes through the channel 120, an error may occur in the codeword. For example, the channel 120 may be a wired/wireless communication channel, and when the signal transmission system 100 is a storage device, the channel 120 may be a channel connecting a storage controller and a non-volatile memory device.

The G-LDPC decoder 130 may receive a codeword from the channel 120 and perform G-LDPC decoding on the codeword to detect and correct an error included in the codeword.

The G-LDPC decoder 130 may include an LDPC decoder 131 and a GC decoder 132. The codeword may include information bits, inner parity bits and outer parity bits. The LDPC decoder 131 may perform LDPC decoding in which each bit of the codeword corresponds to variable nodes, and update the variable nodes and check nodes based on the connection between the variable nodes defined in the PCM and the check nodes, thereby correcting word errors. The GC decoder 132 may receive information bits and inner parity bits from the codeword corrected by the LDPC decoder 131, and perform a GC decoding operation on the information bits and inner parity bits. The G-LDPC decoder 130 may correct an error of a codeword through iterative decoding of the LDPC decoder 131 and the GC decoder 132, and output information bits included in the error-corrected codeword.

In embodiments, in an example of the signal transmission system 100 which transmits a large amount of data, the number of information bits to be subjected to LDPC encoding may increase. To reduce the amount of computation and computation time required for LDPC encoding of a large amount of information bits, an LDPC code may be designed such that an LDPC encoding operation may be divided into a plurality of unit operations, and the plurality of unit operations may be parallelized. However, when the same design is applied to a G-LDPC code including a plurality of super check nodes, parallelization of a plurality of unit operations may be limited due to connections between super check nodes.

Therefore, embodiments may relate to a method for designing a G-LDPC code including super check nodes and a method for parallel processing of G-LDPC encoding based on the designed G-LDPC code. Hereinafter, a method of designing a G-LDPC code according to an example embodiment is described in detail with reference to FIGS. 2A to 6B.

Figure 2A:
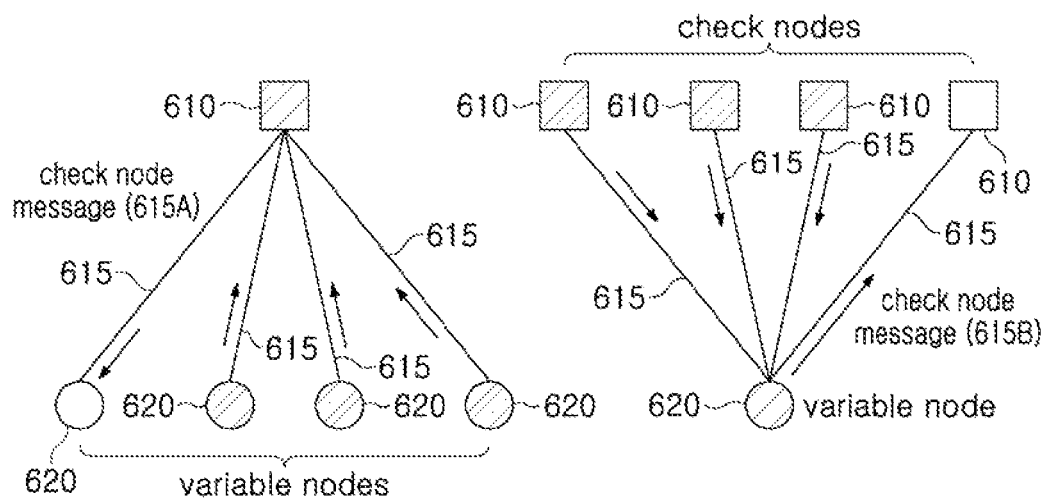
Figure 2B:
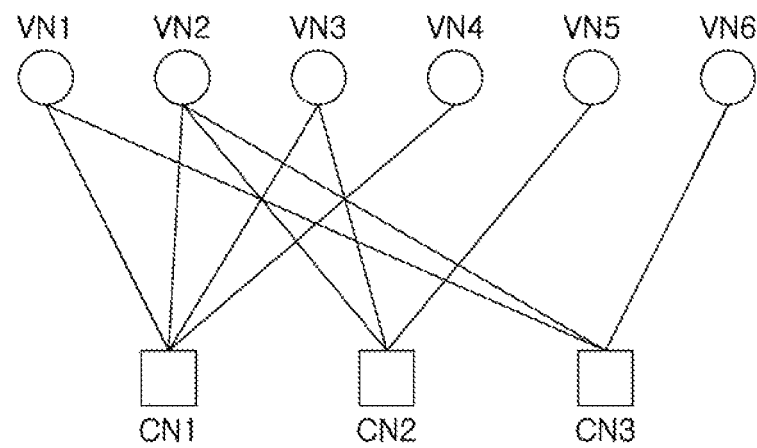

FIGS. 2A to 2C are diagrams illustrating examples of an LDPC code and LDPC decoding in detail.

FIG. 2A illustrates LDPC decoding represented by a Tanner graph.

An LDPC code may refer to a code in which the number of elements having a value of one (1) in respective row and column of a parity check matrix defining the LDPC code is very small. Referring to FIG. 2A, the LDPC code includes check nodes 610 and variable nodes 620, and the structure thereof may be defined by the Tanner graph which includes edges 615 connecting the check nodes 610 and the variable nodes 620.

A check node 610 may transmit a value to the variable node 620 after the check node update as a check node message 615A, and a variable node 620 may transmit a value to a check node 610 after the variable node update is variable node message 615B. In LDPC decoding, errors in codewords may be corrected through repeated message exchanges between the check nodes 610 and the variable nodes 620.

FIG. 2B illustrates a Tanner graph of an LDPC code.

Referring to FIG. 2B, the Tanner graph of the LDPC graph may include three check nodes CN1 to CN3 representing parity check equations of a given LDPC code, six variable nodes VN1 to VN6 representing respective bits of codewords, and edges representing connection thereof. The edges may connect check nodes CN1 to CN3 and variable nodes VN1 to VN6 according to a parity check matrix. The number of edges connected to a variable node or check node in the Tanner graph may be referred to as a degree of the variable node or check node.

Initial values of the variable nodes VN1 to VN6 may be hard decision data or soft decision data. The hard decision data may represent only whether each bit of the codeword is zero (0) or one (1), and the soft decision data may further include the value of each bit of the codeword and the log-likelihood ratio (LLR) that indicates reliability information of the bit value.

In embodiments, the number of variable nodes and check nodes illustrated in FIG. 2B and the connection of the variable nodes and check nodes are only examples, and LDPC codes may be implemented in various sizes and various connections.

FIG. 2C illustrates the PCM corresponding to the Tanner graph of FIG. 2B.

PCM may be used for LDPC encoding and LDPC decoding. In the example of FIG. 2C, the PCM may include six (6) columns and three (3) rows. The six columns and three rows may respectively correspond to the variable nodes VN1 to VN6 and check nodes CN1 to CN3 illustrated in FIG. 2B. Each element included in the PCM may represent a connection between a variable node and a check node that intersect. For example, a value of one (1) of an element at a point where the first variable node VN1 and the first check node CN1 intersect indicates that the first variable node VN1 and the first check node CN1 are connected. A value of zero (0) of an element at a point where the first variable node VN1 and the second check node CN2 intersect may indicate that the first variable node VN1 and the second check node CN2 are not connected.

In embodiments, as described above, the variable nodes VN1 to VN6 may correspond to respective bits of a codeword. The codeword may include information bits and parity bits generated based on LDPC encoding of the information bits.

The PCM may include an information column matrix including columns corresponding to information bits, and a parity column matrix including columns corresponding to parity bits. Depending on the implementation, the parity column matrix may have a diagonal structure.

LDPC encoding may be a type of linear block code, and may include a process of determining parity bits that satisfy the condition of Equation 1 below.

$$H \cdot c^T = [h_1 h_2 h_3 \ldots h_{n-1}] \cdot c^T = \Sigma_{i=0}^{N} c_i \cdot h_i = 0 \qquad \text{(Equation 1)}$$

In Equation 1, H denotes the PCM, c denotes a codeword where $c=[c_0, c_1, c_2, \ldots, c_{n-1}]$, $c_i$ denotes the i-th bit of the codeword, and N denotes the length of the LDPC code. In this case, $h_i$ denotes the i-th column of the PCM. According to Equation 1, LDPC encoding may be understood as an operation of solving simultaneous equations defined by the PCM to find values of unknown parity bits when values of information bits are given.

When the parity column matrix has a diagonal structure, one element having a value of one (1) in a column corresponding to each parity bit may be one, and the remaining elements may have a value of zero (0). For example, the degree of the variable node corresponding to the parity bit may be one (1). When the degree of the variable node is one (1), because the number of check nodes connected to the variable node is one, an operation for finding the value of each parity bit may be simplified. Thus, LDPC encoding may be efficiently performed.

In embodiments, the PCM may include a plurality of sub-blocks and may be implemented with a Quasi-Cyclic (QC) structure including a cyclic shifted identity matrix or a zero matrix of Q*Q size in the sub-blocks. The cyclic shifted identity matrix may refer to a matrix in which respective elements of the identity matrix are cyclically shifted to the right or left.

When the PCM has a QC structure, an encoding operation and a decoding operation for respective rows of the sub block may be divided into independent unit operations, and the unit operations may be processed in parallel. Therefore, the implementation of the encoder and decoder may be facilitated and the calculation speed may be improved.

Figure 3A:
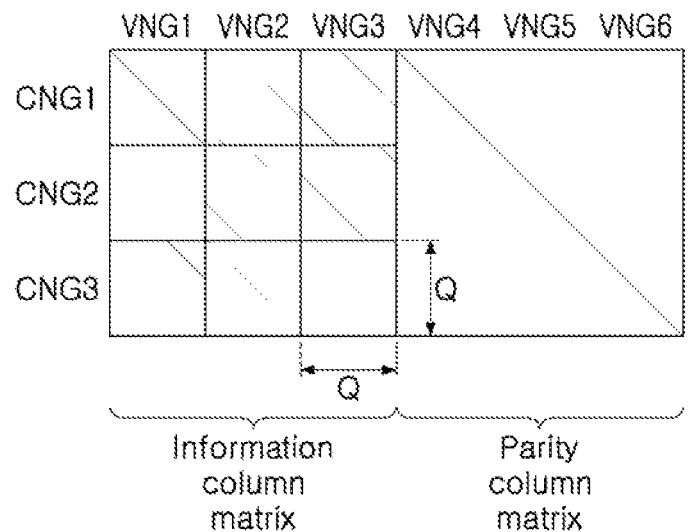
FIGS. 3A and 3B are diagrams illustrating LDPC codes having a QC structure, according to an embodiment.
Figure 3B:
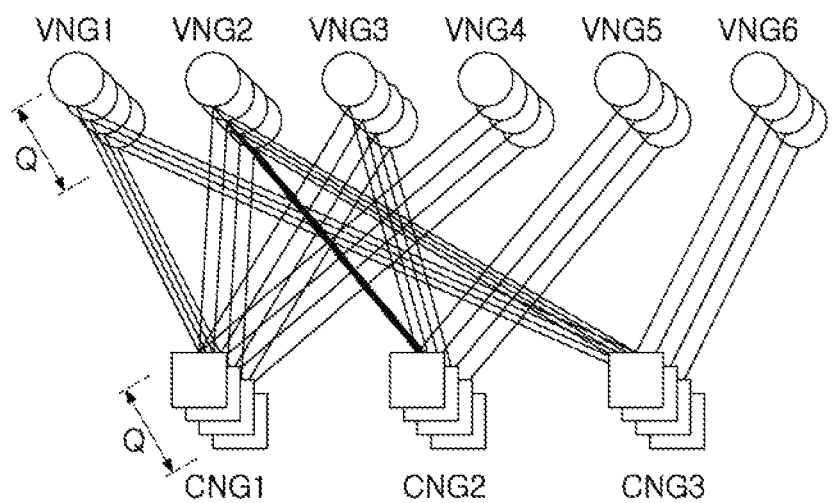

FIGS. 3A and 3B are diagrams illustrating the LDPC code having the QC structure.

FIG. 3A illustrates the PCM of the LDPC code having the QC structure.

The LDPC code PCM having the QC structure illustrated in FIG. 3A may be generated by lifting the PCM of the LDPC code described with reference to FIG. 2C. Like the PCM of FIG. 2C, the PCM to be lifted may be referred to as a base matrix or the like.

The PCM of FIG. 3A may include an information column matrix and a parity column matrix like the PCM of FIG. 2C. Referring to FIG. 3A, the information column matrix may include a plurality of sub blocks. Each of the sub-blocks may include a zero matrix of size Q*Q or a cyclic shifted identity matrix of size Q*Q. For example, an element having a value of one (1) in the PCM of FIG. 2C may be expanded to a cyclic shifted identity matrix in the PCM of. 3A, and an element having a value of zero (0) in the PCM of FIG. 2C may be expanded to a zero matrix in the PCM of FIG. 3A. A size at which each of the cyclic shifted identity matrices included in the information column matrix is cyclically shifted may be determined according to a predetermined lifting rule.

In the PCM of FIG. 3A, the parity column matrix may have a dual diagonal structure. The degree of the columns other than the last column of the parity column matrix is two (2), and the degree of the last column may be one (1). Even when the parity column matrix has a dual-diagonal structure, LDPC encoding may be efficiently performed similarly to the case in which the parity column matrix has a diagonal structure. A lifting rule different from a lifting rule applied to an information column matrix may be applied to the parity column matrix such that the parity column matrix may have a structure in which LDPC encoding may be efficiently performed, such as a dual-diagonal structure.

In the PCM of FIG. 3A, diagonal lines indicated in the plurality of sub blocks and the parity column matrix represent elements having a value of one (1), and elements excluding elements having a value of one (1) in the plurality of sub blocks and the parity column matrix may have a value of zero (0).

When the PCM of FIG. 2C is lifted, the variable nodes VN1 to VN6 may be expanded into variable node groups VNG1 to VNG6 respectively including Q variable nodes, and the check nodes CN1 to CN6 may be expanded to check node groups CNG1 to CNG3 respectively including Q check nodes.

FIG. 3B illustrates a Tanner graph corresponding to the parity check matrix of FIG. 3A.

The Tanner graph of the LDPC having the QC structure illustrated in FIG. 3B may be generated by lifting the Tanner graph of the LDPC illustrated in FIG. 2B. For example, the Tanner graph illustrated in FIG. 2B is a graph that is the basis of the lifted graph illustrated in FIG. 3B and may be referred to as a protograph or a base graph.

The lifted graph of FIG. 3B may have the form of Q copies of the protograph of FIG. 2B. The Q copies may be not connected to each other through an edge. Thus, the Q copies may be respectively, independently computed. For example, when the LDPC having the QC structure is used, the encoding operation and the decoding operation may be divided into independent unit operations and processed in parallel.

In embodiments, the LDPC code described with reference to FIGS. 2A to 3B may detect codeword errors by performing a single parity check on variable nodes connected to the check node. G-LDPC, which may detect codeword errors by generalizing the concept of a check node and checking multiple conditions for variable nodes connected to a super check node, is being studied.

Figure 4A:
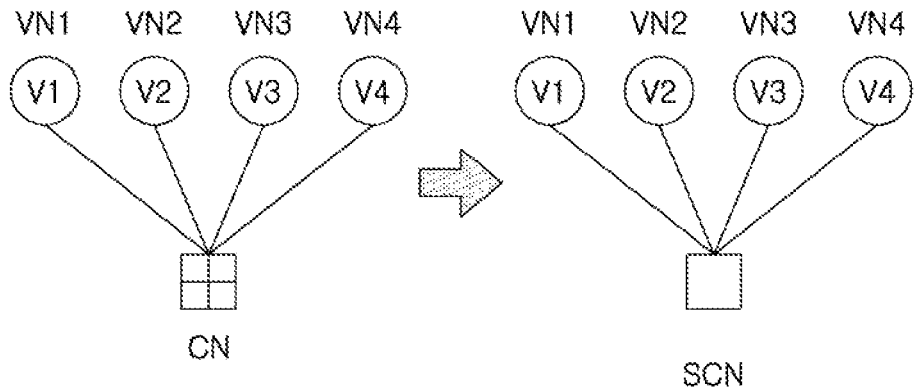
FIGS. 4A and 4B are diagrams illustrating a Generalized LDPC (G-LDPC) code, according to an embodiment.
Figure 4B:
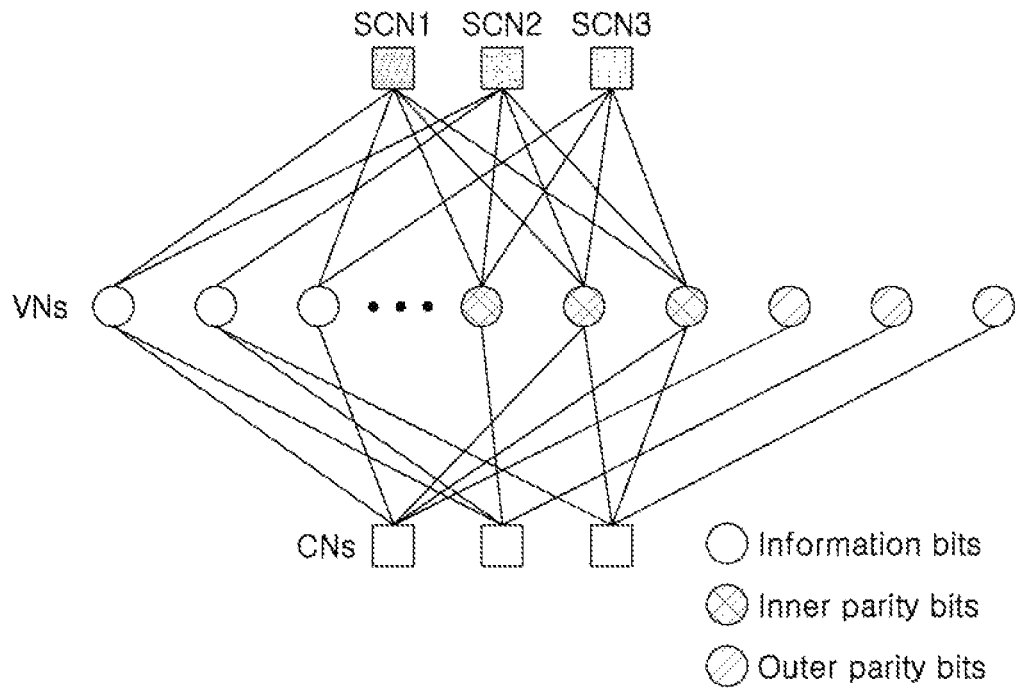

FIGS. 4A and 4B are diagrams illustrating the G-LDPC code.

FIG. 4A is a diagram illustrating a single check node and a super check node that may be included in a G-LDPC code.

Referring to FIG. 4A, LDPC encoding and LDPC decoding may be performed on the variable nodes VN1 to VN4 connected to the single check node CN according to whether a single parity check condition is satisfied. For example, it may be checked whether the sum of the variable nodes VN1 to VN4 is zero (0).

The concept of a single check node CN may be expanded to a super check node SCN. GC encoding and GC decoding may be performed on the variable nodes VN1 to VN4 connected to the super check node SCN according to whether multiple conditions are satisfied. For example, the success of LDPC decoding may be determined by checking whether all three conditions of (VN1+VN2+VN3)=0, (VN1+VN3+VN4)=0 and (VN2+VN4)=0 are satisfied.

In embodiments, the multiple conditions of the super check node SCN are not limited to the example described with reference to FIG. 4A. For example, binary codes such as BCH codes, Hamming codes, and polar codes may be used as multiple conditions, and non-binary codes may also be used. G-LDPC codes including super check nodes (SCNs) may have good code characteristics such as a large minimum Hamming distance, high iterative decoding performance, fast decoding convergence speed, and low error floor compared to LDPC codes containing only single check nodes.

FIG. 4B is a diagram illustrating a Tanner graph of a G-LDPC code including a single check node and a super check node.

FIG. 4B illustrates a Tanner graph of a G-LDPC code in which a GC code including a plurality of super check nodes SCN1 to SCN3 and an LDPC code including a plurality of single check nodes CNs are concatenated.

The G-LDPC code may include a plurality of variable nodes VNs. The variable nodes VNs may include information bit variable nodes corresponding to information bits, inner parity variable nodes corresponding to inner parity bits, and outer parity variable nodes corresponding to outer parity bits.

In the G-LDPC code of FIG. 4B, the GC code may be an inner code, and the LDPC code may be an outer code. GC encoding may be performed first to perform G-LDPC encoding, and LDPC encoding may be performed on the GC encoding result. Variable nodes corresponding to the outer parity bits may be not connected to the super check nodes SCN1 to SCN3. The values of the outer parity bits may be determined only based on LDPC code encoding.

In the G-LDPC code of FIG. 4B, the variable nodes corresponding to the inner parity bits may be connected to the super check nodes SCN1 to SCN3, respectively.

When the G-LDPC code is designed, the coding scheme and code rate that may be adopted for each super check node may be limited. For example, a coding scheme and code rate whose error correction performance has been verified may be adopted for each super check node. For example, it may be difficult to arbitrarily reduce the number of parity bits generated at each super check node.

According to an example embodiment of the disclosure, the same coding scheme and the same code rate may be adopted for the super check nodes SCN1 to SCN3, and G-LDPC codes may be designed such that the super check nodes SCN1 to SCN3 are connected to all variable nodes corresponding to the inner parity bits, respectively. Regardless of the number of super check nodes SCN1 to SCN3, the number of inner parity bits may be maintained, and the overall code rate of the G-LDPC code may be maintained.

When the super check nodes SCN1 to SCN3 share variable nodes, values of inner parity bits may be determined by comprehensively considering results of decoding operations for the respective super check nodes. For example, it may be difficult to parallelize operations for the respective super check nodes SCN1 to SCN3. Even if the G-LDPC code having the QC structure is designed by lifting the G-LDPC code, parallel processing performance may be limited because it is difficult to parallelize the operations for the respective super check nodes SCN1 to SCN3.

Figure 5A:
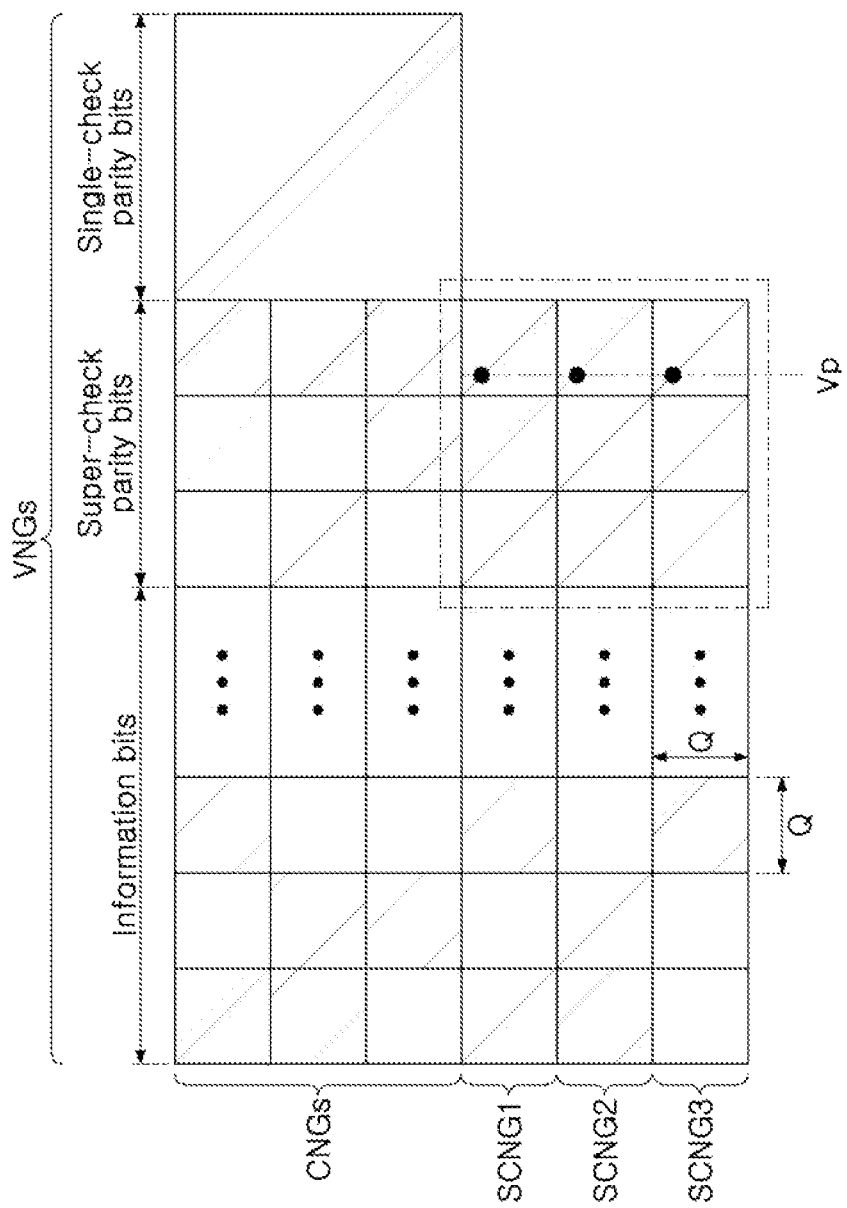
FIGS. 5A and 5B are diagrams illustrating a parity check matrix of a G-LDPC code having a QC structure, according to an embodiment.
Figure 5B:
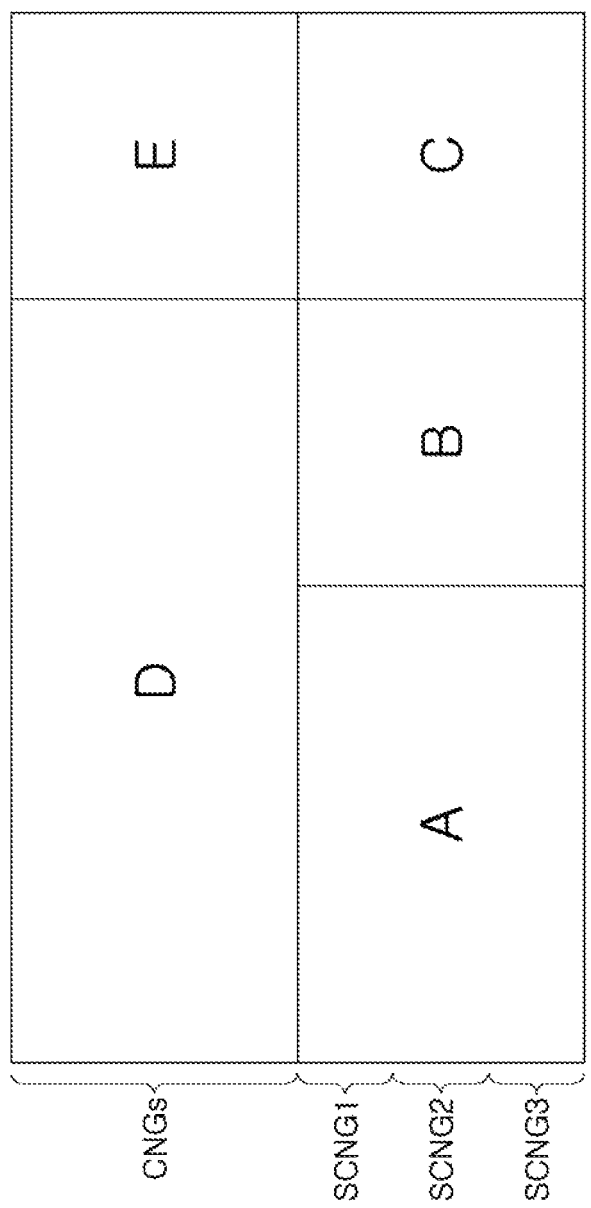

FIGS. 5A and 5B are diagrams illustrating PCM of a G-LDPC code having a QC structure.

FIG. 5A illustrates the PCM of the lifted G-LDPC using the Tanner graph described with reference to FIG. 4B as a protograph. FIG. 5B briefly illustrates the structure of the PCM of FIG. 5A.

Referring to FIG. 5A, the G-LDPC code may be lifted in a manner similar to the lifting method of the LDPC code described with reference to FIGS. 3A and 3B. The plurality of variable nodes VNs may be expanded into variable node groups VNGs each having Q variable nodes, and a plurality of single check nodes CNs and super check nodes SCN1 to SCN3 may be expanded to single check node groups CNGs with Q single check nodes and super check node groups SCNG1 to SCNG3 with Q super check nodes, respectively.

Referring to FIG. 5B, the PCM of the lifted G-LDPC code may have a structure in which the PCM of the GC code and the PCM of the LDPC code are concatenated. For example, the PCM of the GC code may include an information column matrix A corresponding to information bits and a parity column matrix B corresponding to inner parity bits. Since the super check nodes of the GC code have nothing to do with the outer parity bits, columns corresponding to the outer parity bits may be a zero matrix C. The PCM of the LDPC code may include an information column matrix D corresponding to information bits and inner parity bits, and a parity column matrix E corresponding to outer parity bits.

As described with reference to FIG. 4B, super check nodes SCN1 to SCN3 and variable nodes corresponding to inner parity bits may be connected to each other on a protograph. Referring back to FIG. 5A, in the PCM of the lifted G-LDPC, the subblocks in which the super check node groups SCNG1 to SCNG3 and the variable node groups corresponding to the inner parity bits intersect may be represented by an identity matrix of size Q*Q.

Referring to FIGS. 5A and 5B, it may be difficult for the parity column matrix B included in the PCM of the GC code to have a structure capable of efficiently performing GC encoding, such as a diagonal structure or a dual-diagonal structure.

For example, referring to FIG. 5A, the degree of each of the variable nodes corresponding to the inner parity bits may be three (3). For example, a total of three super check nodes selected respectively from the super check node groups SCNG1 to SCNG3 may be connected to one of the variable nodes for example the variable node Vp. If it is necessary to perform an encoding operation on three super check nodes to determine the value of one inner parity bit, it may be difficult to perform parallel processing on the respective super check node groups SCNG1 to SCNG3.

In embodiments, if all super check nodes included in the super check node groups SCNG1 to SCNG3 are designed to generate different inner parity bits, the number of inner parity bits increases and the code rate of the G-LDPC code may decrease.

Embodiments may relate to a method capable of processing encoding operations of the respective super check nodes SCN1 to SCN3 in parallel while maintaining the code rate of the G-LDPC code.

Figure 6A:
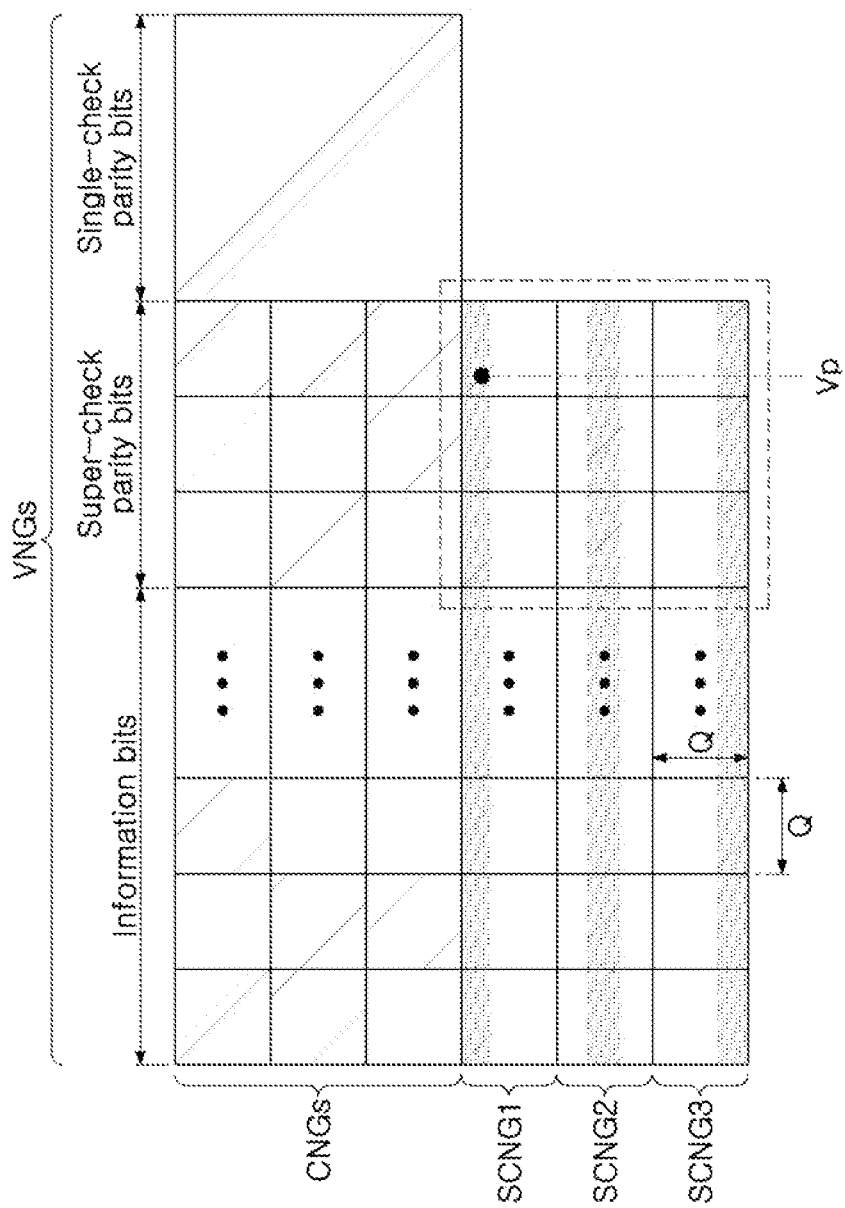
FIGS. 6A and 6B are diagrams illustrating a parity check matrix of a G-LDPC code having a QC structure according to an embodiment.
Figure 6B:
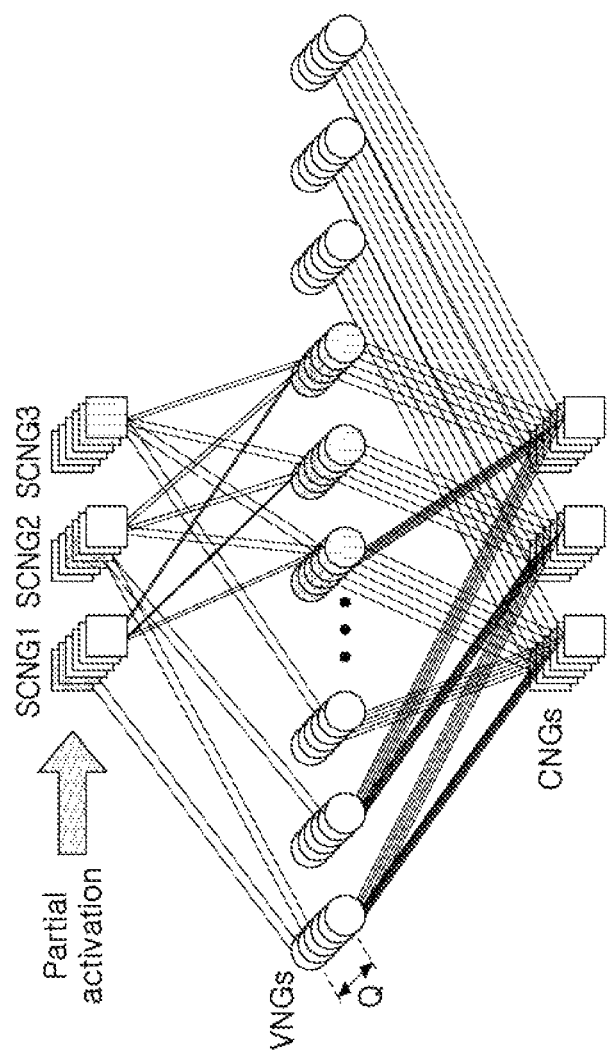

FIGS. 6A and 6B are diagrams illustrating PCM of a G-LDPC code having a QC structure according to an example embodiment.

FIG. 6A is a diagram illustrating PCM of a G-LDPC code having a QC structure.

The PCM illustrated in FIG. 6A may have the same structure as the PCM illustrated in FIG. 5A, and only values of elements included the PCM may be different.

In detail, according to an example embodiment, in the PCM illustrated in FIG. 6A, some of the rows included in the PCM of the GC code may be activated and the remaining rows may be deactivated. Deactivation of a row may mean that super check nodes corresponding to the row are not used for G-LDPC encoding.

In the PCM of FIG. 6A, activated rows among rows corresponding to super check nodes are shaded. In addition, all elements included in the inactive rows may be expressed as having a value of zero (0).

Among the rows included in the PCM of the GC code, an activated row and an inactive row may be selected such that the degrees of variable nodes corresponding to inner parity bits may all be one (1). For example, a total of Q rows may be selected from the super check node groups SCNG1 to SCNG3, and elements included in the Q rows in the parity column matrix may be selected to have a value of one (1) in different columns.

For example, rows corresponding to super check nodes in each of the super check node groups SCNG1 to SCNG3 may be sequentially indexed. Rows having different indices may be selected from each of the super check node groups SCNG1 to SCNG3. If Q=256, the first to 85th rows of the first super check node SCNG1 may be selected, the 86th to 170th rows of the second super check node SCNG2 may be selected, and the 171st to 256th rows of the third super check node SCNG3 may be selected.

FIG. 6B is a diagram illustrating a Tanner graph of a G-LDPC code with a QC structure.

The Tanner graph of FIG. 6B may correspond to the PCM of FIG. 6A. The Tanner graph of FIG. 6B may include Q copies of the protograph of FIG. 4B.

According to an example embodiment, some check nodes among check nodes included in each of the super check node groups SCNG1 to SCNG3 may be activated. A pattern may be illustrated in the check nodes activated in FIG. 6B.

Activated check nodes may be connected to different variable nodes among variable nodes corresponding to inner parity bits, thereby determining values of different inner parity bits.

According to an example embodiment, each of the variable nodes corresponding to the inner parity bits may be connected to one super check node. For example, the encoding operation of a certain super check node may be performed independently of the operation of other super check nodes. Accordingly, respective operations of the super check node groups SCNG1 to SCNG3 may be processed in parallel.

Figure 7:
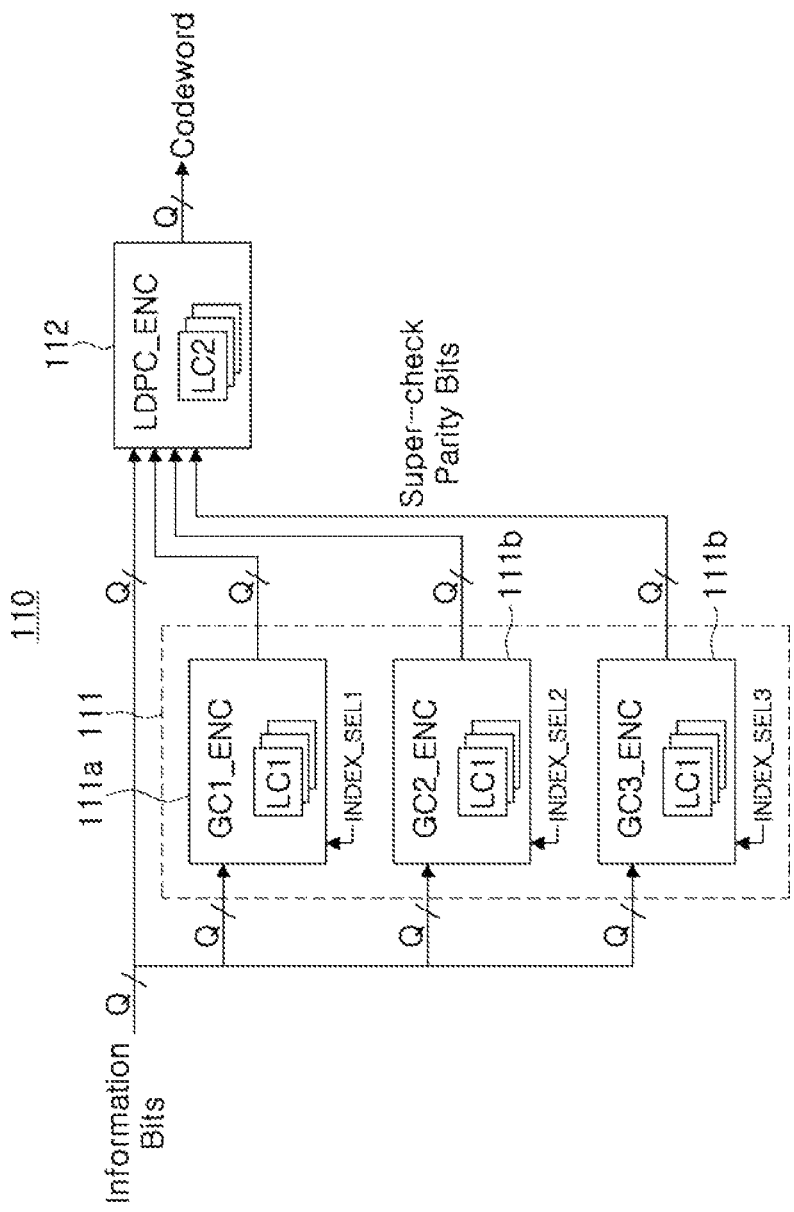
FIG. 7 is a block diagram illustrating a G-LDPC encoder according to an embodiment.

FIG. 7 is a block diagram illustrating a G-LDPC encoder according to an example embodiment.

Referring to FIG. 7, the G-LDPC encoder 110 may include a GC encoder 111 and an LDPC encoder 112. The G-LDPC encoder 110 of FIG. 7 may correspond to the G-LDPC encoder 110 described with reference to FIG. 1. The G-LDPC encoder 110 of FIG. 7 may perform encoding using the G-LDPC code having the QC structure described with reference to FIGS. 6A and 6B.

According to an example embodiment, in the G-LDPC code having the QC structure, only some check nodes among super check nodes may be activated such that the degree of variable nodes corresponding to inner parity bits becomes one (1). Therefore, encoding operations of different super check node groups in the G-LDPC code may be performed independently of each other.

According to an example embodiment, the GC encoder 111 may include a plurality of GC encoders capable of independently performing an encoding operation of each of the super check node groups. For example, the GC encoder 111 may include a first GC encoder 111a (illustrated as "GC1_ENC") for performing an encoding operation of the first super check node group SCNG1, a second GC encoder 111b (illustrated as "GC2_ENC") for performing an encoding operation of the second super check node group SCNG2, and a third GC encoder 111c (illustrated as "GC3_ENC") for performing an encoding operation of the third super check node group SCNG3.

In embodiments, the G-LDPC code according to an example embodiment may be operated in parallel as a code having a QC structure. Depending on the implementation, the first to third GC encoders 111a, 111b, and 111c include first logic circuits LC1 capable of performing an operation on each of the super check nodes included in the super check node group.

Each of the first logic circuits LC1 may include a circuit in which a protograph of a GC code representing a connection between one super check node and variable nodes is implemented in hardware. For example, the first logic circuits LC1 included in the first GC encoder 111a may implement a connection between the first super check node SCN1 of FIG. 4B and variable nodes in hardware.

For example, the first logic circuits LC1 may include a plurality of variable node processors, a super check node processor, and a connection structure between the plurality of variable node processors and the super check node processor based on the protograph of the GC code. The super check node processor may perform a binary code operation such as a BCH code operation or a Hamming code operation, or a non-binary code operation.

In embodiments, the protograph may have a structure as illustrated in FIG. 4B, and all of the variable node processors corresponding to inner parity variable nodes in the plurality of first logic circuits LC1 may be connected to the super check node processor.

Information bits may be input to the G-LDPC encoder 110. The information bits may be divided into Q sub-information bits and input to the first to third GC encoders 111a, 111b, and 111c and the LDPC encoder 112.

Each of the Q sub-information bits input to the first to third GC encoders 111a, 111b, and 111c may be input to the first logic circuits LC1. According to an example embodiment, among the first logic circuits LC1, only logic circuits corresponding to activated rows of the GC code may be enabled. For example, the first to third GC encoders 111a, 111b, and 111c may enable the logic circuits in response to selection signals INDEX_SEL1, INDEX_SEL2, and INDEX_SEL3, respectively. Enabled logic circuits may operate in parallel to create super check parity nodes.

The first to third GC encoders 111a, 111b, and 111c may each output Q inner parity bits. Only inner parity bits corresponding to activated rows in each of the first to third GC encoders 111a, 111b, and 111c may be generated. Inner parity bits output from each of the first to third GC encoders 111a, 111b, and 111c may be input to the LDPC encoder 112.

Depending on the implementation, the first to third GC encoders 111a, 111b, and 111c may set inner parity bits corresponding to inactive rows to a value of zero (0) value and output a total of Q inner parity bits. If the initial values of the variable nodes are soft decision data, LLRs of inner parity bits corresponding to inactive rows may be set to infinity ('∞').

The LDPC encoder 112 may generate outer parity bits by performing an LDPC encoding operation on the information bits and inner parity bits. The LDPC encoder 112 may include second logic circuits LC2 for processing single check nodes included in single check node groups in parallel. Each of the second logic circuits LC2 may include a plurality of variable node processors, single check node processors, and a connection structure between the plurality of variable node processors and the single check node processors based on a protocol graph of an LDPC code having a QC structure.

The LDPC encoder 112 may combine inner parity bits generated from the enabled first logic circuit LC1 among inner parity bits received from each of the first to third GC encoders 111a, 111b, and 111c.

The information bits and the combined inner parity bits may be divided into Q sub information bits and Q sub inner parity bits and input to the second logic circuits LC2. The second logic circuits LC2 included in the LDPC encoder 112 may perform LDPC encoding operations in parallel.

The G-LDPC encoder 110 may output information bits, inner parity bits, and outer parity bits as codewords.

According to an example embodiment, the G-LDPC encoder 110 deactivates some of the rows corresponding to the super check nodes in the G-LDPC code having the QC structure, such that the first to third GC encoders 111a, 111b and 111c may independently generate inner parity bits. Accordingly, parallel processing performance of the first to third GC encoders 111a, 111b, and 111c may be improved.

Figure 8:
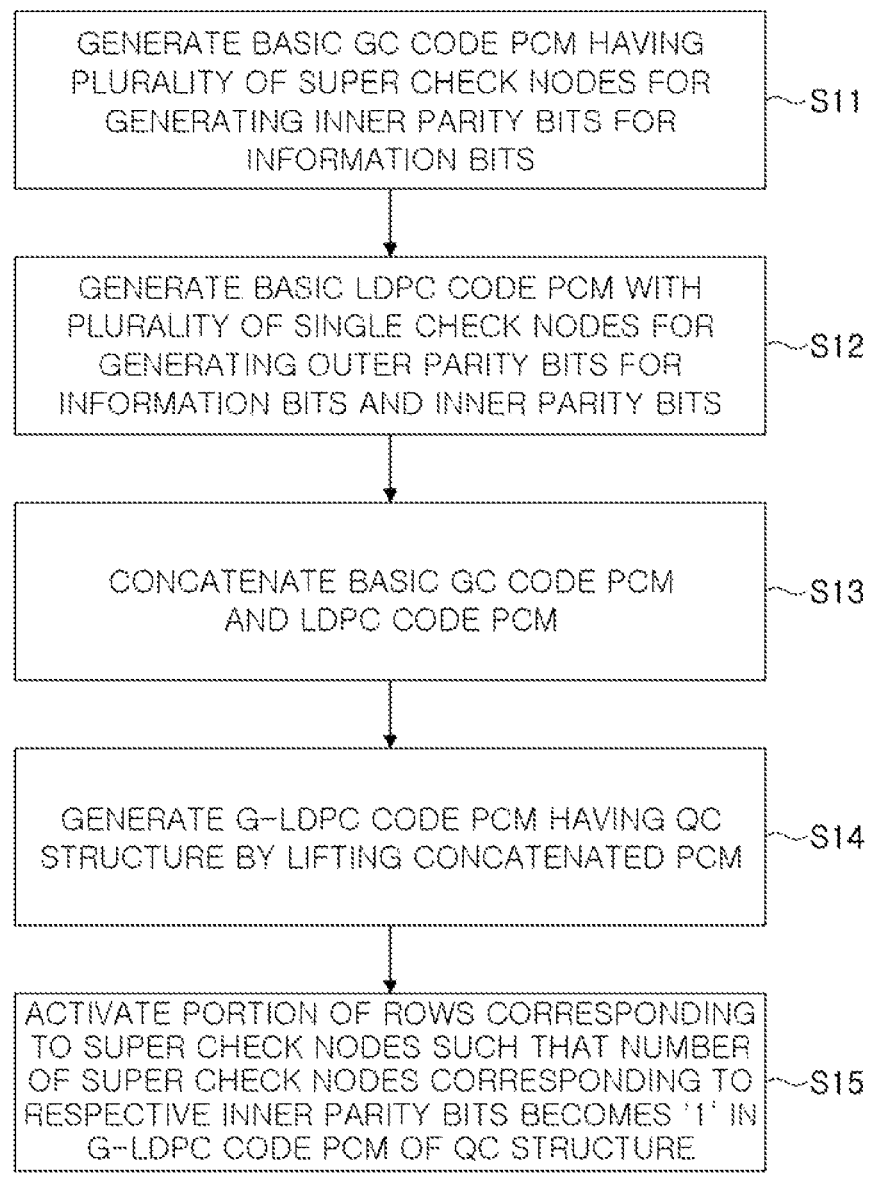
FIG. 8 is a flowchart illustrating a method of generating a parity check matrix of a G-LDPC code having a QC structure according to an embodiment.

FIG. 8 is a flowchart illustrating a method of generating a PCM of a G-LDPC code having a QC structure according to an example embodiment.

In operation S11, a basic GC code PCM with a plurality of super check nodes for generating inner parity bits for information bits may be generated. As described with reference to FIG. 4B, variable nodes corresponding to the plurality of inner parity bits may be connected to the plurality of respective super check nodes. For example, in the basic GC code PCM, all elements of the parity column matrix may be generated to have a value of one (1).

In operation S12, a basic LDPC code PCM having a plurality of single check nodes for generating outer parity bits for the information bits and the inner parity bits may be generated.

In operation S13, the basic GC code PCM and the basic LDPC code PCM may be concatenated. In the concatenated PCM, the basic GC code PCM may be an inner code PCM, and the basic LDPC code PCM may be an outer code PCM.

In operation S14, a G-LDPC code PCM having a QC structure may be generated by lifting the concatenated PCM. The G-LDPC code having the QC structure may include a GC code PCM having the QC structure and an LDPC code PCM having the QC structure.

In the GC code PCM having the QC structure, each of the subblocks included in the parity column matrix may have an identity matrix. As a result, in the parity column matrix, variable nodes corresponding to super-check parity nodes may become multi-degree variable nodes, and may not have an efficient structure such as a diagonal structure or a dual-diagonal structure.

In operation S15, in the G-LDPC code PCM having the QC structure, a portion of the rows corresponding to the super check nodes may be activated such that the degree of each of the variable nodes corresponding to the inner parity bits becomes one (1), and the remaining some may be disabled. For example, since the parity generation positions of the super check parity nodes may not overlap each other, GC encoding may be efficiently performed as in the case in which the parity column matrix has a diagonal structure.

Figure 9:
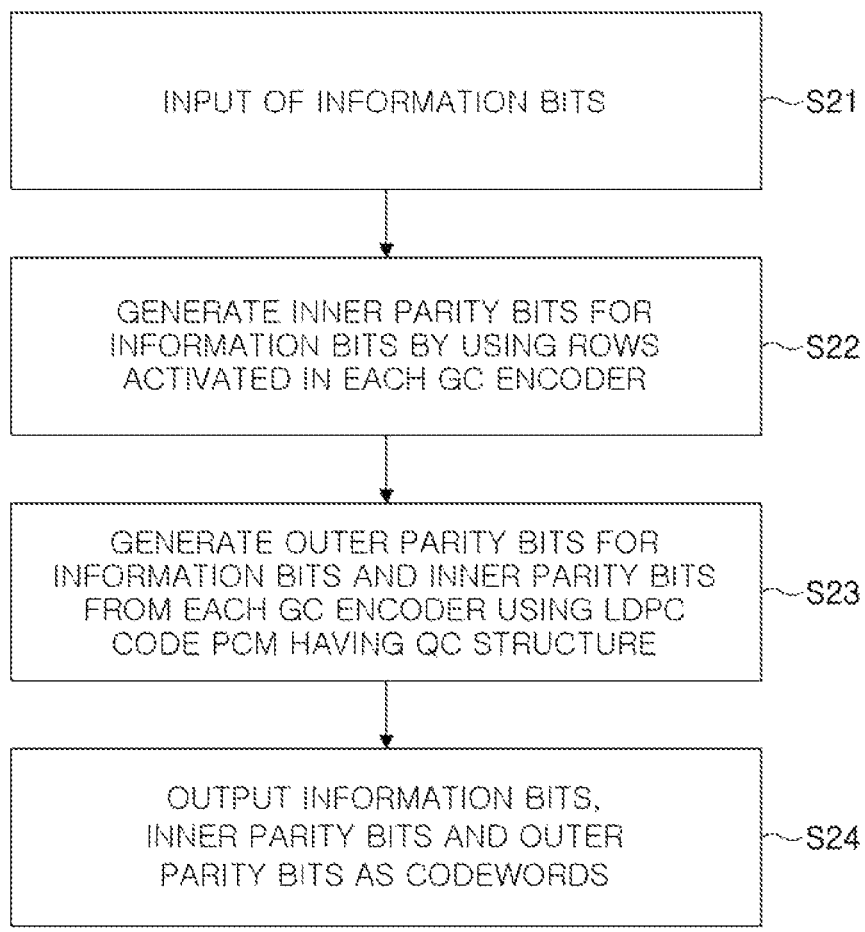
FIG. 9 is a flowchart illustrating a G-LDPC encoding method based on a parity check matrix of having QC structure according to an embodiment.

FIG. 9 is a flowchart illustrating a G-LDPC encoding method based on a parity check matrix having a QC structure according to an example embodiment.

In operation S21, information bits may be input.

In operation S22, inner parity bits for information bits may be generated by performing a GC encoding operation based on rows activated in each GC encoder. GC encoding operations for the respective activated rows may be performed in parallel.

In operation S23, outer parity bits may be generated by performing LDPC encoding on the information bits and inner parity bits using PCM of the LDPC code. The PCM of the LDPC code may have a QC structure, and LDPC encoding operations may be performed in parallel.

In operation S24, the information bits, inner parity bits and outer parity bits may be output as codewords.

According to an example embodiment, to generate the base matrix of the G-LDPC code, the LDPC code PCM may be concatenated with the GC code PCM in which variable nodes corresponding to inner parity bits have multiple degrees. By lifting the base matrix, a G-LDPC code PCM having a QC structure may be generated, and in the G-LDPC code PCM, the degree of variable nodes corresponding to inner parity bits may correspond to super check nodes such that the degree is one (1), and may disable some of the rows. According to this embodiment, the parallel processing performance of the G-LDPC code having the QC structure may be improved without increasing the code rate of the G-LDPC code.

A G-LDPC encoder and a G-LDPC decoder based on the G-LDPC code having the QC structure according to an example embodiment may be applied to a storage device including a non-volatile memory. When the G-LDPC encoder and the G-LDPC decoder are applied to a storage device, data input/output performance may be improved because data may be quickly encoded and decoded using parallel processing. In addition, because the code rate of data stored in the non-volatile memory may be improved, the storage space of the non-volatile memory may be efficiently used. Hereinafter, a storage device to which the G-LDPC code having the QC structure may be applied is described in detail below with reference to FIGS. 10 to 14, according to embodiments.

Figure 10:
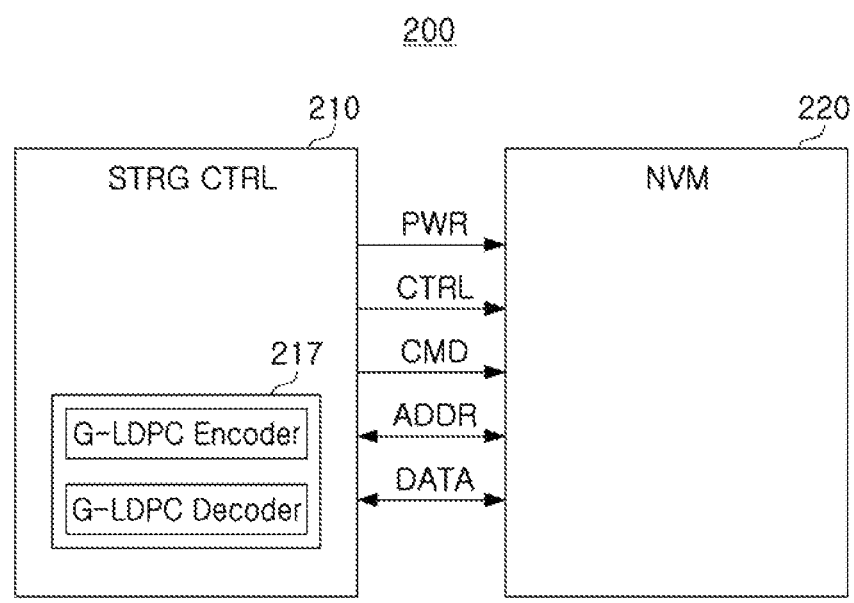
FIG. 10 is a block diagram illustrating a storage device according to an embodiment.

FIG. 10 is a block diagram illustrating a storage device according to an example embodiment.

A storage device 200 may include a storage controller 210 (illustrated as "STRG CTRL") and a non-volatile memory device 220 (illustrated as "NVM").

The non-volatile memory device 220 may perform erase, write, and read operations under the control of the storage controller 210. The non-volatile memory device 220 may receive a command CMD, an address ADDR, and data DATA from the storage controller 210 through an input/output line. Also, the non-volatile memory device 220 may receive power PWR from the storage controller 210 through a power line and receive a control signal CTRL from the storage controller 210 through a control line. The control signal CTRL may include a command latch enable (CLE), an address latch enable (ALE), a chip enable (nCE), a write enable (nWE), a read enable (nRE), and the like.

The storage controller 210 may control an overall operation of the non-volatile memory device 220. The storage controller 210 may include a G-LDPC unit 217 that corrects error bits. The G-LDPC unit 217 may include a G-LDPC encoder and a G-LDPC decoder.

The G-LDPC encoder may generate data to which parity bits are added by performing error correction encoding on data to be programmed into the non-volatile memory device 220. Data and parity bits may be stored in the non-volatile memory device 220.

The G-LDPC decoder may perform error correction decoding on data read from the non-volatile memory device 220. The G-LDPC decoder may determine whether error correction decoding is successful and may output an indication signal according to the determination result. The G-LDPC decoder may correct error bits of data using parity bits generated in the G-LDPC encoding process.

The G-LDPC encoder and G-LDPC decoder included in the G-LDPC unit 217 of FIG. 10 may correspond to the G-LDPC encoder 110 and the G-LDPC decoder 130 of FIG. 1, respectively.

According to an example embodiment, the G-LDPC unit 217 may encode or decode data based on the G-LDPC code having the QC structure in which the GC code and the LDPC code are concatenated. The GC code may include information variable nodes, inner parity variable nodes, and a plurality of super check nodes for performing multiple condition checks, and the inner parity variable nodes may be connected to the plurality of super check nodes respectively. The LDPC code may include the information variable nodes, the inner parity variable nodes, the outer parity variable nodes, and a plurality of single check nodes for performing a single parity check.

According to an example embodiment, by deactivating a portion of the super check nodes, the inner parity variable nodes in the GC code may be adjusted to have a first degree.

The G-LDPC encoder may generate inner parity bits, by performing GC encoding based on the adjusted GC code, on information bits received from the outside, for example the outside of the storage controller 210 or the storage device 200, and may generate outer parity bits by performing LDPC encoding based on the LDPC code on the information bits and inner parity bits. The storage controller 210 may store the information bits, inner parity bits, and outer parity bits as codewords in the non-volatile memory device 220.

Codewords may be programmed into memory cells of the non-volatile memory device 220. Codewords programmed into memory cells may become distorted over time, and distorted codewords may include error bits.

The G-LDPC decoder may read a codeword from the non-volatile memory device 220, correct an error of the read codeword by performing LDPC decoding on the read codeword based on the LDPC code, and may correct errors in the information bits and inner parity bits by performing GC decoding based on the adjusted GC code on the information bits and inner parity bits included in the corrected codeword.

The G-LDPC decoder may repeatedly perform the LDPC decoding and GC decoding until the syndrome check based on the LDPC code and the syndrome check based on the adjusted GC code succeed.

According to an example embodiment, because respective operations of a plurality of super check nodes performing the multi-condition check may be processed in parallel, G-LDPC encoding for data to be programmed in the non-volatile memory device 220 may be quickly performed. Thus, the storage device 200 may quickly store data received from the outside.

In embodiments, the storage controller 210 and the non-volatile memory device 220 may be integrated into a single semiconductor device. For example, the storage controller 210 and the non-volatile memory device 220 may be integrated into a single semiconductor device to form a solid state drive (SSD). A solid state drive may include a storage device configured to store data in a semiconductor memory.

For example, the storage controller 210 and the non-volatile memory device 220 may be integrated into a single semiconductor device to form a memory card. For example, the storage controller 210 and the non-volatile memory device 220 may be integrated into a single semiconductor device, to configure a memory card such as a PC (personal computer memory card international association (PCM-CIA)) card, a compact flash (CF) card, a smart media (SM) card (SMC), memory stick, a multimedia card (MMC), a reduced-size MMC (RS-MMC), an MMCmicro card, a secure digital (SD) card, a miniSD card, a microSD card, an SD High Capacity (SDHC) card, an SD extended capacity (SDXC) card, an SD ultra capacity (SDUC) card, a Universal Flash Storage (UFS), or the like.

Figure 11:
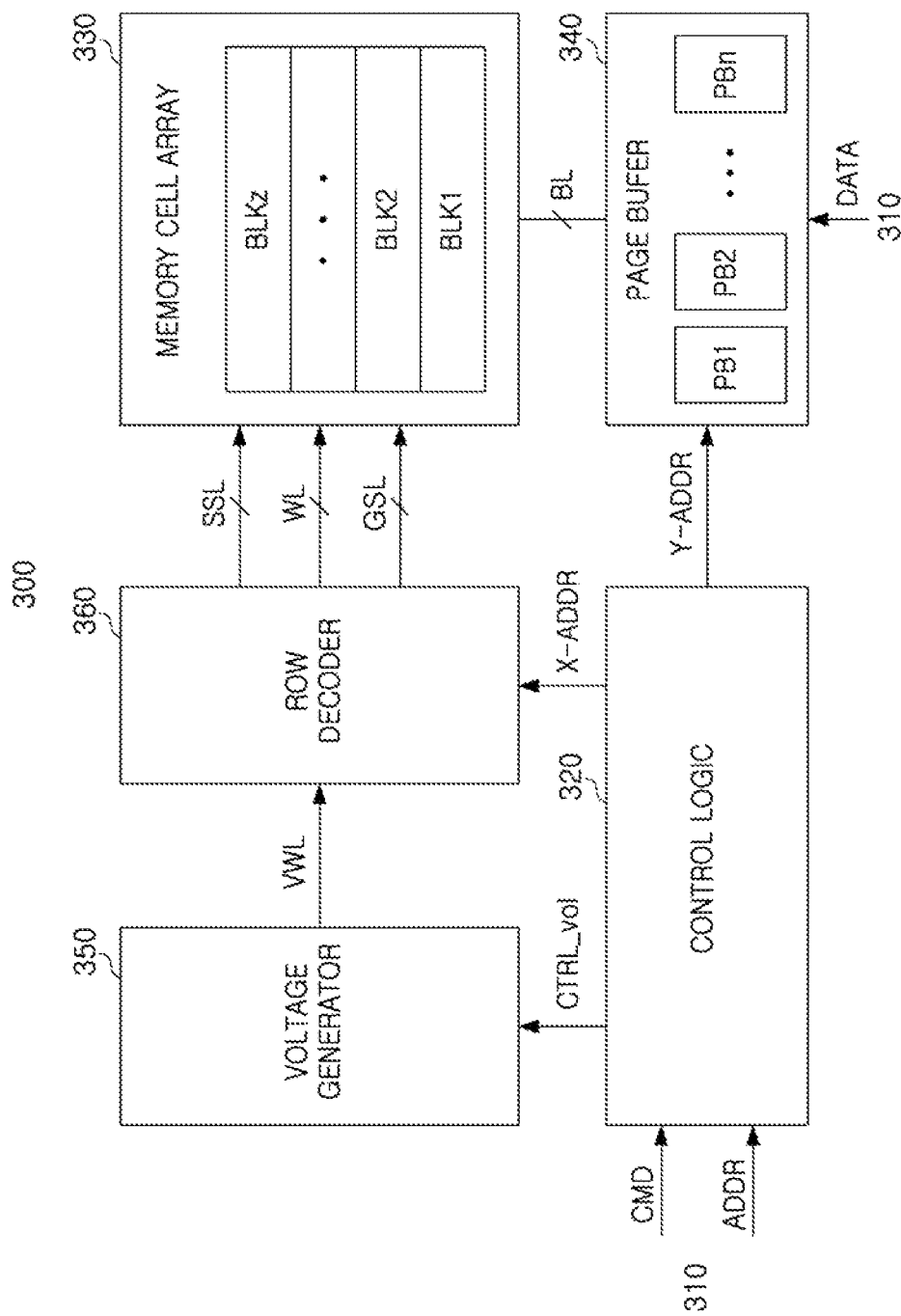
FIG. 11 is a diagram illustrating a non-volatile memory of FIG. 10 in more detail, according to an embodiment.

FIG. 11 is a diagram illustrating an example of the non-volatile memory of FIG. 10 in more detail.

Referring to FIG. 11, a memory device 300 may include a control logic circuit 320, a memory cell array 330, a page buffer 340, a voltage generator 350, and a row decoder 360. Although not illustrated in FIG. 11, the memory device 300 may further include a memory interface circuit 310 illustrated in FIG. 15, and further include column logic, a pre-decoder, a temperature sensor, a command decoder, an address decoder, and the like. In embodiments, the memory device 300 may correspond to or be included in the non-volatile memory 220 of FIG. 10.

The control logic circuit 320 may generally control various operations within the memory device 300. The control logic circuit 320 may output various control signals in response to the command CMD and/or the address ADDR from the memory interface circuit 310. For example, the control logic circuit 320 may output a voltage control signal CTRL_vol, a row address X-ADDR, and a column address Y-ADDR.

The memory cell array 330 may include a plurality of memory blocks BLK1 to BLKz (where z is a positive integer), and each of the plurality of memory blocks BLK1 to BLKz may include a plurality of memory cells. The memory cell array 330 may be connected to the page buffer 340 through bit lines BL, and may be connected to the row decoder 360 through word lines WL, string select lines SSL, and ground select lines GSL.

In an example embodiment, the memory cell array 330 may include a three-dimensional (3D) memory cell array, and the 3D memory cell array may include a plurality of NAND strings. Each NAND string may include memory cells respectively connected to word lines vertically stacked on a substrate. The disclosures of U.S. Pat. Nos. 7,679,133, 8,553,466, 8,654,587, 8,559,235, and U.S. Patent Application Publication No. 2011/0233648 are incorporated by reference herein in their entireties. In an example embodiment, the memory cell array 330 may include a two-dimensional (2D) memory cell array, and the 2D memory cell array may include a plurality of NAND strings disposed in row and column directions.

The page buffer 340 may include a plurality of page buffers PB1 to PBn (where n is an integer greater than or equal to 3), and the plurality of page buffers PB1 to PBn may be respectively connected to the memory cells through a plurality of bit lines BL. The page buffer 340 may select at least one bit line from among the bit lines BL in response to the column address Y-ADDR. The page buffer 340 may operate as a write driver or a sense amplifier according to an operation mode. For example, during a program operation, the page buffer 340 may apply a bit line voltage corresponding to data to be programmed to a selected bit line. During a read operation, the page buffer 340 may detect data stored in a memory cell by sensing a current or voltage of a selected bit line.

The voltage generator 350 may generate various types of voltages for performing program, read, and erase operations based on the voltage control signal CTRL_vol. For example, the voltage generator 350 may generate a program voltage, a read voltage, a program verify voltage, an erase voltage, and the like as the word line voltage VWL.

The row decoder 360 may select one of the plurality of word lines WL and select one of the plurality of string select lines SSL in response to the row address X-ADDR. For example, during a program operation, the row decoder 360 may apply a program voltage and a program verify voltage to the selected word line, and during a read operation, may apply a read voltage to the selected word line.

Figure 12:
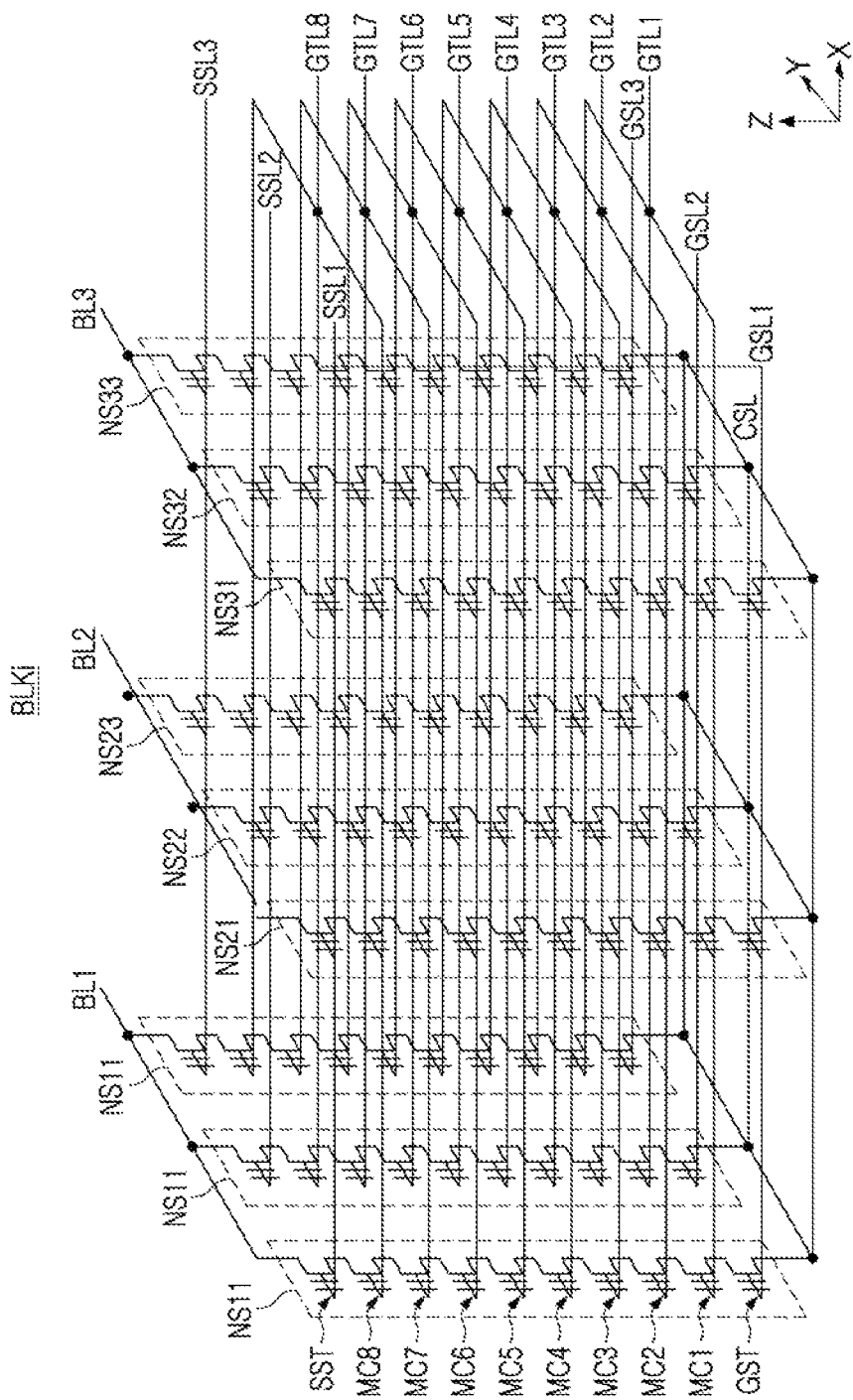
FIG. 12 is a diagram illustrating a 3D V-NAND structure applicable to a storage device according to an embodiment.

FIG. 12 is a diagram illustrating a 3D V-NAND structure applicable to a storage device according to an example embodiment.

When the non-volatile memory of the storage device is implemented as a 3D V-NAND type flash memory, each of a plurality of memory blocks included in the non-volatile memory may be expressed as an equivalent circuit as illustrated in FIG. 12.

The memory block BLKi illustrated in FIG. 12 represents a three-dimensional memory block formed in a three-dimensional structure on a substrate. For example, a plurality of memory NAND strings included in the memory block BLKi may be formed in a direction perpendicular to the substrate.

Referring to FIG. 12, the memory block BLKi may include a plurality of memory NAND strings NS11 to NS33 connected between the bit lines BL1, BL2, and BL3 and the common source line CSL. Each of the plurality of memory NAND strings NS11 to NS33 may include a string select transistor SST, a plurality of memory cells MC1, MC2, . . . , and MC8, and a ground select transistor GST. FIG. 16 illustrates that each of the plurality of memory NAND strings NS11 to NS33 includes eight memory cells MC1, MC2, . . . , and MC8, but embodiments are not limited thereto.

The string select transistor SST may be connected to corresponding string select lines SSL1, SSL2, and SSL3. The plurality of memory cells MC1, MC2, . . . , and MC8 may be connected to corresponding gate lines GTL1, GTL2, . . . , and GTL8, respectively. The gate lines GTL1, GTL2, . . . , and GTL8 may correspond to word lines, and some of the gate lines GTL1, GTL2, . . . , and GTL8 may correspond to dummy word lines. The ground select transistor GST may be connected to corresponding ground select lines GSL1, GSL2, and GSL3. The string select transistor SST may be connected to corresponding bit lines BL1, BL2, and BL3, and the ground select transistor GST may be connected to the common source line CSL.

Word lines (e.g., WL1) having the same height may be commonly connected, and ground select lines GSL1, GSL2, and GSL3 and string select lines SSL1, SSL2, and SSL3 may be separated respectively. FIG. 16 illustrates that the memory block BLK is connected to eight gate lines GTL1, GTL2, . . . , and GTL8 and three bit lines BL1, BL2, and BL3, but embodiments are not limited thereto.

When memory cells included in the memory block BLK are programmed, threshold voltages of the memory cells may form constant probability distributions. Threshold voltage distributions may be mapped to different logic states.

Figure 13A:
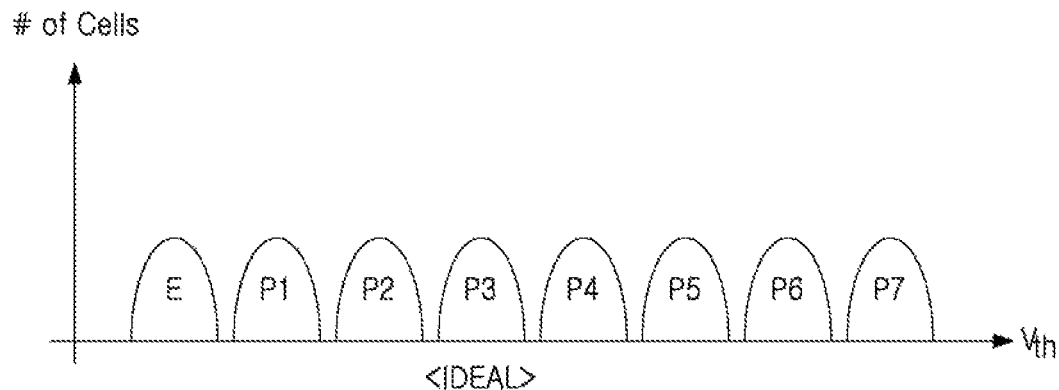
FIGS. 13A and 13B are diagrams illustrating threshold voltage distributions of memory cells, according to an embodiment.
Figure 13B:
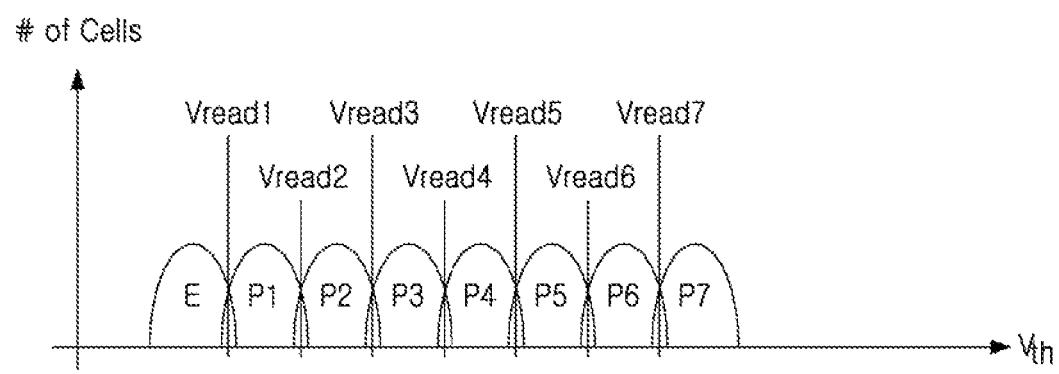

FIGS. 13A and 13B are diagrams illustrating threshold voltage distributions of memory cells.

In the graphs illustrated in FIGS. 13A and 13B, the horizontal axis represents the threshold voltage level (illustrated as "Vth"), and the vertical axis represents the number of memory cells (illustrated as "# of cells"). FIGS. 13A and 13B illustrate a logic state indicated by each threshold voltage distribution, taking a case in which the memory cell is a triple level cell (TLC) storing 3-bit data as an example.

When three bits are programmed into memory cells of a TLC memory device, one of eight threshold voltage distributions may be formed in the memory cell.

Due to minute differences in electrical characteristics between the plurality of memory cells, respective threshold voltages of the memory cells programmed with the same data form a threshold voltage distribution within a certain range. In the case of TLC, as illustrated in the drawing, a threshold voltage distribution of seven program states P1 to P7 and a threshold voltage distribution of one erase state E are formed. FIG. 13A is an ideal distribution diagram, in which no state distribution overlaps, and each threshold voltage distribution has a read voltage margin within a certain range.

As illustrated in FIG. 13B, in the case of a flash memory, over time, a charge loss in which electrons trapped in a floating gate or a tunnel oxide are released may occur. In addition, while repeating program and erase, the tunnel oxide deteriorates, and charge loss may further increase. A charge loss may reduce the threshold voltage. For example, the distribution of threshold voltages may be shifted to the left.

In addition, program disturbance, erase disturbance, and/or back pattern dependency phenomena may increase the distribution of threshold voltages with each other. Accordingly, due to the deterioration of characteristics of the memory cell due to the above reasons, threshold voltage distributions of adjacent states from among the erase state E and the program states P1 to P7 may overlap each other, as shown with respect to one or more of a plurality of read voltages Vread1 to Vread7, as illustrated in FIG. 13B.

If threshold voltage distributions overlap, read data may contain many errors. For example, if the memory cell is in an on state when the third read voltage Vread3 is applied, the memory cell is determined to be in the second program state P2, and if the memory cell is in an off state, the memory cell is determined to be in the third program state P3. However, when the third read voltage Vread3 is applied in the period where the second program state P2 and the third program state P3 overlap, although the memory cell is in an off state, it may be read in an on state. Accordingly, as the threshold voltage distributions overlap, many error bits may be included in the read data.

According to an example embodiment of the disclosure, by using the G-LDPC code having the QC structure, errors in read data may be quickly corrected, and error correction performance may be improved. Thus, data stored in the non-volatile memory device may be accurately read.

Figure 14:
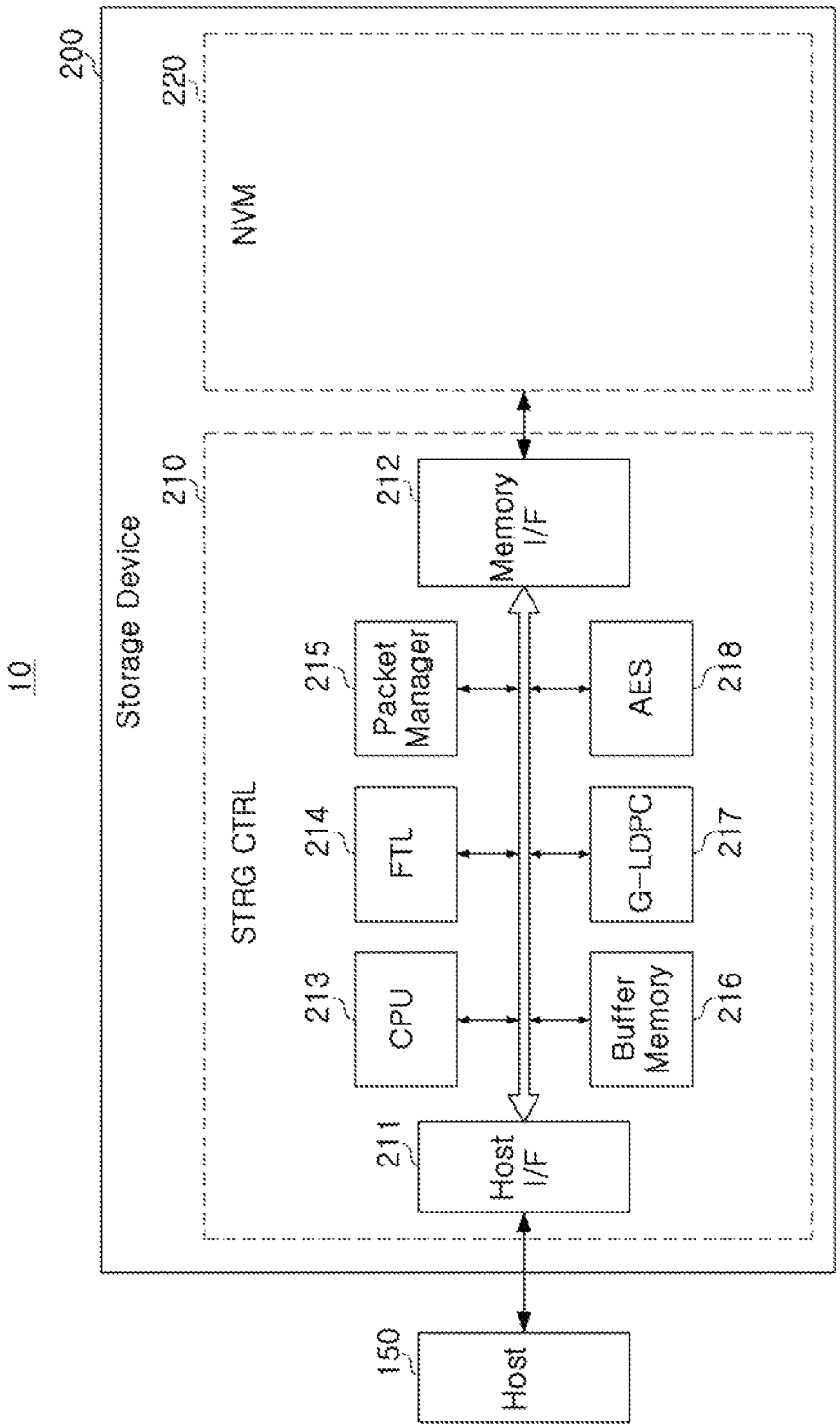
FIG. 14 is a block diagram illustrating a storage device according to an embodiment.

FIG. 14 is a block diagram illustrating a storage device according to an example embodiment in more detail.

A host-storage system 10 may include a host 150 and the storage device 200. Also, the storage device 200 may include the storage controller 210 and the non-volatile memory 220.

The host 150 may include electronic devices, for example, portable electronic devices such as mobile phones, MP3 players, and laptop computers, or electronic devices such as desktop computers, game consoles, TVs, and projectors. The host 150 may include at least one operating system (OS). The operating system may manage and control overall functions and operations of the host 150.

The storage device 200 may include storage media for storing data according to a request from the host 150. As an example, the storage device 200 may include at least one of an SSD, an embedded memory, and a removable external memory. When the storage device 200 is an SSD, the storage device 200 may be a device conforming to the non-volatile memory express (NVMe) standard. When the storage device 200 is an embedded memory or an external memory, the storage device 200 may be a device conforming to a universal flash storage (UFS) standard or an embedded multimedia card (eMMC) standard. The host 150 and the storage device 200 may respectively generate and transmit packets according to adopted standard protocols.

The non-volatile memory device 220 may retain stored data even when power is not supplied. The non-volatile memory device 220 may store data provided from the host 150 through a program operation and output data stored in the non-volatile memory device 220 through a read operation.

When the non-volatile memory device 220 includes a flash memory, the flash memory may include a 2D NAND memory array or a 3D (or vertical) NAND (VNAND) memory array. As another example, the storage device 200 may include other various types of non-volatile memories. For example, examples of the storage device 200 may include magnetic RAM (MRAM), spin-transfer torque MRAM, conductive bridging RAM (CBRAM), ferroelectric RAM (FeRAM), phase RAM (PRAM), resistive memory (Resistive RAM) and other various types of memory.

The storage controller 210 may control the non-volatile memory device 220 in response to a request from the host 150. For example, the storage controller 210 may provide data read from the non-volatile memory device 220 to the host 150 and store the data provided from the host 150 in the non-volatile memory device 220. For this operation, the storage controller 210 may support read, program, and erase operations of the non-volatile memory device 220.

The storage controller 210 may include a host interface 211, a memory interface 212, and a central processing unit (CPU) 213. In addition, the storage controller 210 may further include a flash translation layer (FTL) 214, a packet manager 215, a buffer memory 216, an error correction code (ECC) 217 engine, and an advanced encryption standard (AES) engine 218. The storage controller 210 may further include a working memory (not illustrated) into which the FTL 214 is loaded, and the CPU 213 may execute the flash translation layer 214 to thereby control data writing and reading operations for the non-volatile memory device 220.

The host interface 211 may transmit/receive packets with the host 150. A packet transmitted from the host 150 to the host interface 211 may include a command or data to be written to the non-volatile memory device 220, and a packet transmitted from the host interface 211 to the host 150 may include a response to a command or data read from the non-volatile memory device 220.

The memory interface 212 may transmit data to be written to the non-volatile memory device 220 to the non-volatile memory device 220 or may receive data read from the non-volatile memory device 220. The memory interface 212 may be implemented to comply with standards such as Toggle or Open NAND Flash Interface (ONFI).

The flash translation layer 214 may perform various functions such as address mapping, wear-leveling, and garbage collection. The address mapping operation may be an operation of changing a logical address received from the host 150 into a physical address used to actually store data in the non-volatile memory device 220. Wear-leveling may be a technique for preventing excessive deterioration of a specific block by ensuring that blocks in the non-volatile memory device 220 are uniformly used, and may be implemented by, for example, a firmware technology that balances erase counts of physical blocks. Garbage collection may be a technique for securing usable capacity in the non-volatile memory device 220 by copying valid data of a block to a new block and then erasing the old block.

The packet manager 215 may generate a packet according to an interface protocol negotiated with the host 150 or parse various types of information from a packet received from the host 150. Also, the buffer memory 216 may temporarily store data to be written to the non-volatile memory device 220 or data to be read from the non-volatile memory device 220. The buffer memory 216 may be included in the storage controller 210, but may be disposed outside the storage controller 210.

The G-LDPC unit 217 may perform error detection and correction functions for read data read from the non-volatile memory device 220. For example, the G-LDPC unit 217 may generate parity bits for write data to be written in the non-volatile memory device 220, and the parity bits generated in this manner may be stored in the non-volatile memory device 220 along with the write data. When data is read from the non-volatile memory device 220, the G-LDPC unit 217 may correct an error in the read data by using parity bits read from the non-volatile memory device 220 together with the read data, and output corrected read data. The G-LDPC unit 217 of FIG. 14 may correspond to the G-LDPC unit 217 described with reference to FIG. 10.

The AES engine 218 may perform at least one of an encryption operation and a decryption operation on data input to the storage controller 210 using a symmetric-key algorithm.

Figure 15:
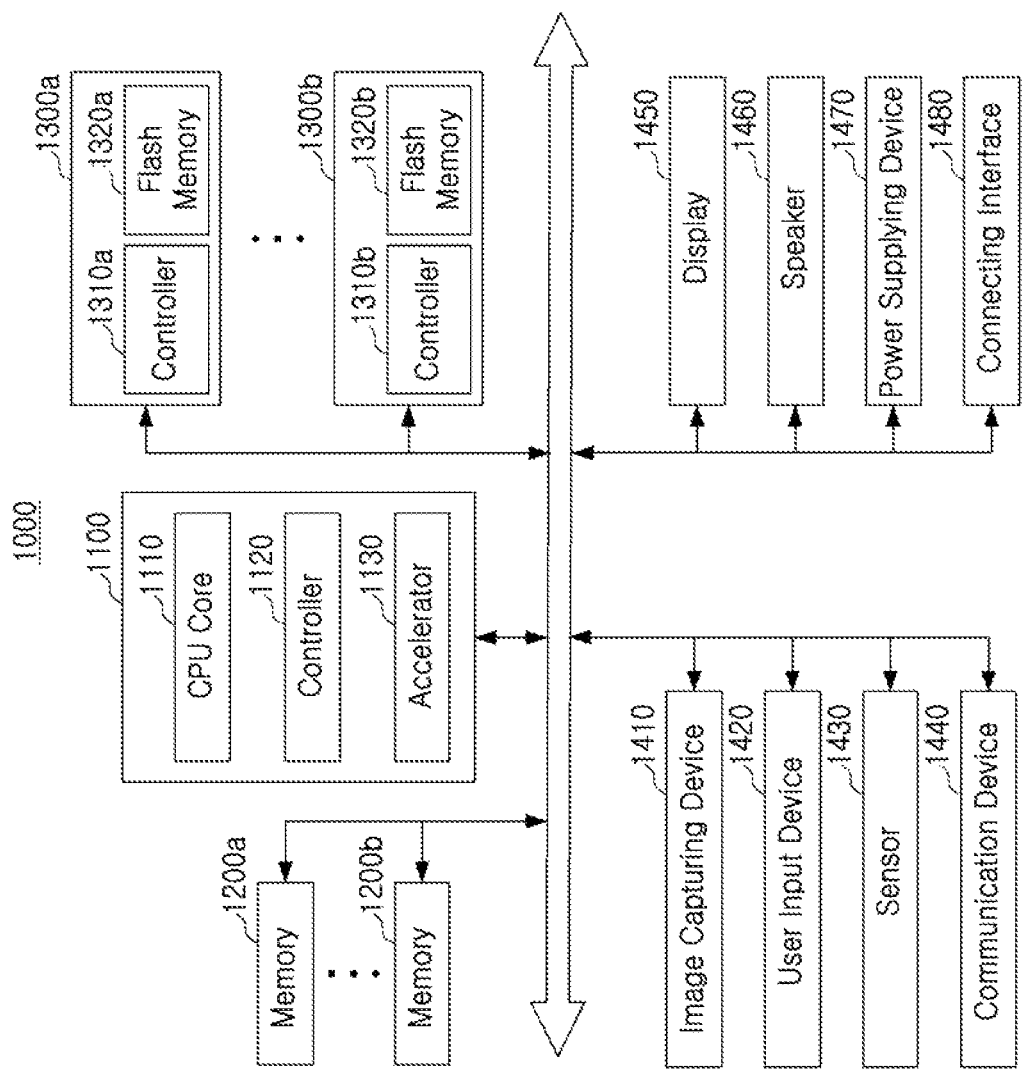
FIG. 15 is a diagram illustrating a system to which a storage device may be applied, according to an embodiment.

FIG. 15 is a diagram illustrating a system to which a storage device according to an example embodiment may be applied.

A system 1000 of FIG. 15 may be a mobile system, such as a mobile phone such as a mobile phone, a smart phone, a tablet personal computer (PC), a wearable device, a healthcare device, or an internet of things (JOT) device. However, the system 1000 of FIG. 15 is not limited to a mobile system, and may be used for a personal computer, a laptop computer, a server, a media player, or an automotive device such as a navigation system.

Referring to FIG. 15, the system 1000 may include a main processor 1100, memories 1200a and 1200b, and storage devices 1300a and 1300b, and may further include one or more of an image capturing device 1410, a user input device 1420, a sensor 1430, a communication device 1440, a display 1450, a speaker 1460, a power supplying device 1470 and a connecting interface 1480.

The main processor 1100 may control the overall operation of the system 1000, and in more detail, control the operation of other components included in the system 1000. The main processor 1100 may be implemented as a general-purpose processor, a dedicated processor, or an application processor.

The main processor 1100 may include one or more CPU cores 1110 and may further include a controller 1120 for controlling the memories 1200a and 1200b and/or the storage devices 1300a and 1300b. Depending on example embodiments, the main processor 1100 may further include an accelerator 1130 that is a dedicated circuit for high-speed data operations such as artificial intelligence (AI) data operations. The accelerator 1130 may include a graphics processing unit (GPU), a neural processing unit (NPU), and/or a data processing unit (DPU), and may be implemented as a separate chip physically independent of other components of the main processor 1100.

The memories 1200a and 1200b may be used as main memory devices of the system 1000 and may include volatile memories such as static random-access memory (SRAM) and/or dynamic random-access memory (DRAM), but may include non-volatile memories such as flash memory, parameter random access memory (PRAM), and/or resistive random-access memory (RRAM). The memories 1200a and 1200b may also be implemented in the same package as the main processor 1100.

The storage devices 1300a and 1300b may function as non-volatile storage devices that store data regardless of whether or not power is supplied, and may have a relatively large storage capacity compared to the memories 1200a and 1200b. The storage devices 1300a and 1300b may include storage controllers 1310a and 1310b and non-volatile memories (NVMs) 1320a and 1320b that store data under the control of the storage controllers 1310a and 1310b. The non-volatile memories 1320a and 1320b may include a flash memory of a 2-dimensional (2D) structure or a 3-dimensional (3D) V-NAND (Vertical NAND) structure, but may also include other types of non-volatile memories such as a PRAM and/or RRAM.

The storage devices 1300a and 1300b may be included in the system 1000 while being physically separated from the main processor 1100 or may be implemented in the same package as the main processor 1100. In addition, the storage devices 1300a and 1300b have a form such as an SSD or a memory card, to be detachably coupled to other components of the system 1000 through an interface such as a connecting interface 1480 to be described later. The storage devices 1300a and 1300b may be devices to which standard rules such as UFS, eMMC, or NVMe are applied, but are not limited thereto.

The storage devices 1300a and 1300b according to an example embodiment may add parity bits to data to be stored in the storage devices 1300a and 1300b using the G-LDPC code having the QC structure, and may detect and correct errors in data to be output from the storage devices 1300a and 1300b. In the G-LDPC code having the QC structure according to the example embodiment, since respective super check nodes may be independently processed, G-LDPC encoding and G-LDPC decoding may be performed quickly. Accordingly, data input/output performance of the storage devices 1300a and 1300b may be improved, and reliability of data may be improved.

The image capturing device 1410 may capture a still image or a video, and may be a camera, a camcorder, and/or a webcam.

The user input device 1420 may receive various types of data input from a user of the system 1000, and may be a touch pad, a keypad, a keyboard, a mouse, and/or a microphone or the like.

The sensor 1430 may detect various types of physical quantities that may be acquired from the outside of the system 1000 and convert the detected physical quantities into electrical signals. The sensor 1430 may be a temperature sensor, a pressure sensor, an illuminance sensor, a position sensor, an acceleration sensor, a biosensor, and/or a gyroscope sensor.

The communication device 1440 may transmit and receive signals with other devices outside the system 1000 according to various communication protocols. The communication device 1440 may be implemented by including an antenna, a transceiver, and/or a modem.

The display 1450 and the speaker 1460 may function as output devices that output visual information and auditory information to the user of the system 1000, respectively.

The power supplying device 1470 may appropriately convert power supplied from a battery and/or an external power source embedded in the system 1000 and supply the power to respective components of the system 1000.

The connecting interface 1480 may provide a connection between the system 1000 and an external device connected to the system 1000 and capable of exchanging data with the system 1000. The connecting interface 1480 may be implemented in various interface methods such as an Advanced Technology Attachment (ATA), Serial ATA (SATA), external SATA (e-SATA), Small Computer Small Interface (SCSI), Serial Attached SCSI (SAS), Peripheral Component Interconnection (PCI), PCI express (PCIe), NVMe, IEEE 1394, Universal Serial Bus (USB), SD card, MMC, eMMC, UFS, embedded universal flash storage (eUFS), CF card interface, or the like.

As set forth above, in the G-LDPC encoder according to an example embodiment, by dividing the G-LDPC encoding operation in a plurality of independent operations based on the parity check matrix of the G-LDPC of QC structure and performing operations in parallel, G-LDPC encoding may be performed quickly.

A storage device according to an example embodiment may improve data storage performance and reliability of stored data by quickly performing G-LDPC encoding.

While example embodiments have been illustrated and described above, it will be apparent to those skilled in the art that modifications and variations could be made without departing from the scope as defined by the appended claims.

What is claimed is:

1. A generalized low-density parity-check (G-LDPC) encoder comprising:
a plurality of generalized constraint (GC) encoders configured to perform a plurality of GC encoding operations in parallel based on a GC code having a quasi-cyclic (QC) structure comprising information variable nodes, inner parity variable nodes, and super check nodes configured to perform multiple condition checks, wherein each GC encoder of the plurality of GC encoders comprises a plurality of first logic circuits configured to perform a GC encoding operation of the plurality of GC encoding operations; and
an LDPC encoder configured to perform an LDPC encoding operation based on an LDPC code having the QC structure, wherein the LDPC encoder comprises a plurality of single check nodes configured to perform a single parity check,
wherein the each GC encoder is configured to receive information bits, and to determine parity bits of a portion of inner parity bits corresponding to the information bits by enabling only a portion of the plurality of first logic circuits to perform the GC encoding operation, and
wherein the LDPC encoder is configured to:
obtain the inner parity bits by combining the parity bits obtained from the plurality of GC encoders,
determine outer parity bits corresponding to the information bits and the inner parity bits by performing the LDPC encoding operation, and
output the information bits, the inner parity bits, and the outer parity bits as a codeword.

2. The G-LDPC encoder of claim 1, wherein each first logic circuit of the plurality of first logic circuits comprises a plurality of variable node processors, a super check node processor, and
wherein a connection structure between the plurality of variable node processors and the super check node processor is based on a protograph of the GC code having the QC structure.

3. The G-LDPC encoder of claim 2, wherein, in the each first logic circuit, the connection structure connects the super check node processor and all processors corresponding to the inner parity variable nodes from among the plurality of variable node processors.

4. The G-LDPC encoder of claim 2, wherein the super check node processor is configured to perform a binary code operation comprising at least one of a BCH code operation or a Hamming code operation, or to perform a non-binary code operation.

5. The G-LDPC encoder of claim 1, wherein the LDPC encoder comprises a plurality of second logic circuits configured to perform the LDPC encoding operation in parallel.

6. The G-LDPC encoder of claim 1, wherein the plurality of GC encoders are configured to enable only the portion of the plurality of first logic circuits such that the inner parity bits are respectively connected to different super check nodes.

7. A generalized low-density parity-check (G-LDPC) encoding method, comprising:
generating a basic generalized constraint (GC) code parity check matrix (PCM) comprising information variable nodes, inner parity variable nodes, and a plurality of super check nodes configured to perform multiple condition checks;
generating a basic LDPC code PCM comprising the information variable nodes, the inner parity variable nodes, outer parity variable nodes, and a plurality of single check nodes configured to perform a single parity check;
concatenating the basic GC code PCM and the basic LDPC code PCM to generate a concatenated PCM;

generating a G-LDPC code PCM having a quasi-cyclic (QC) structure by lifting the concatenated PCM;

activating a portion of the plurality of super check nodes such that a number of super check nodes connected to each inner parity variable node is one (1) in the G-LDPC code PCM having the QC structure;

receiving information bits and generating inner parity bits corresponding to the information bits by performing a GC encoding operation based on the activated portion of the plurality of super check nodes;

generating outer parity bits corresponding to the information bits and the inner parity bits by performing an LDPC encoding operation based on the plurality of single check nodes; and outputting the information bits, the inner parity bits and the outer parity bits as codewords.

8. The G-LDPC encoding method of claim 7, wherein the generating of the basic GC code PCM comprises connecting the plurality of super check nodes to the inner parity variable nodes respectively.

9. The G-LDPC encoding method of claim 7, wherein the generating of the basic GC code PCM comprises generating a parity column matrix such that all elements of the parity column matrix comprising columns corresponding to the inner parity variable nodes and rows corresponding to the plurality of super check nodes have a value of one (1).

10. The G-LDPC encoding method of claim 9, wherein the generating of the G-LDPC code PCM having the QC structure comprises expanding the all elements of the parity column matrix of the GC code PCM into an identity matrix.

11. The G-LDPC encoding method of claim 10, wherein the generating of the G-LDPC code PCM having the QC structure further comprises:

expanding each element of an information column matrix comprising columns corresponding to the information variable nodes of the basic LDPC code PCM and columns corresponding to the inner parity variable nodes of the basic LDPC code PCM into a first cyclic shifted identity matrix or a first zero matrix;

expanding a parity column matrix comprising columns corresponding to the outer parity variable nodes of the basic LDPC code PCM into a matrix having a dual-diagonal structure; and expanding each element of an information column matrix comprising columns corresponding to the information variable nodes of the basic GC code PCM into a second cyclic shifted identity matrix or a second zero matrix.

12. The G-LDPC encoding method of claim 7, wherein the generating of the basic GC code PCM comprises:

adopting a same coding scheme and a same code rate for the plurality of super check nodes; and respectively connecting the plurality of super check nodes to the each inner parity variable node.

13. The G-LDPC encoding method of claim 7, wherein the generating of the inner parity bits comprises performing respective operations corresponding to the activated portion of the plurality of super check nodes in parallel.

14. The G-LDPC encoding method of claim 13, wherein the generating of the outer parity bits comprises performing respective operations corresponding to the plurality of single check nodes in parallel.

15. The G-LDPC encoding method of claim 7, wherein the activating of the portion of the plurality of super check nodes comprises setting elements of rows corresponding to inactive nodes from among the plurality of super check nodes in the G-LDPC code PCM having the QC structure to zero (0).

16. The G-LDPC encoding method of claim 7, wherein the activating of the portion of the plurality of super check nodes comprises:

indexing rows corresponding to super check nodes included in each super check node group lifted from plurality of the super check nodes of the basic GC code;

selecting rows having different indices from the each super check node group; and activating only the selected rows.

17. A storage device comprising:

a storage controller configured to:
receive information bits,
generate parity bits for the information bits by performing a generalized low density parity check (G-LDPC) encoding operation based on a G-LDPC code having a quasi-cyclic (QC) structure, and
output the information bits and the parity bits as a codeword; and a non-volatile memory device configured to store the codeword output from the storage controller, wherein the storage controller is further configured to:
adjust a generalized constraint (GC) code comprising information variable nodes, inner parity variable nodes having a degree two or more, and a plurality of super check nodes configured to perform multiple condition checks, by deactivating a portion of the plurality of super check nodes such that the inner parity variable nodes have a degree of one, and
perform the G-LDPC encoding operation based on the G-LDPC code in which the adjusted GC code is concatenated with an LDPC code comprising the information variable nodes, the inner parity variable nodes, outer parity variable nodes, and a plurality of single check nodes configured to perform a single parity check.

18. The storage device of claim 17, wherein the parity bits comprise inner parity bits and outer parity bits, and wherein the storage controller is further configured to generate the inner parity bits by performing a GC encoding operation based on the adjusted GC code on the information bits, and to generate the outer parity bits by performing LDPC encoding operation based on the LDPC code on the information bits and the inner parity bits.

19. The storage device of claim 18, wherein the storage controller is further configured to:

obtain a codeword read from the non-volatile memory device, correct an error in the read codeword by performing an LDPC decoding operation based on the LDPC code on the read codeword to obtain a preliminary corrected codeword, and correct at least one error in the preliminary corrected codeword by performing a GC decoding operation based on the adjusted GC code on information bits and inner parity bits included in the preliminary corrected codeword to obtain a corrected codeword.

20. The storage device of claim 19, wherein the storage controller is further configured to repeatedly perform the LDPC decoding operation and the GC decoding operation until a syndrome check based on the LDPC code and a syndrome check based on the adjusted GC code succeed.

\* \* \* \* \*